(12) United States Patent
Galton et al.

(10) Patent No.: US 9,397,691 B2
(45) Date of Patent: Jul. 19, 2016

(54) MOSTLY-DIGITAL OPEN-LOOP RING OSCILLATOR DELTA-SIGMA ADC AND METHODS FOR CONVERSION

(71) Applicant: The Regents of the University of California, Oakland, CA (US)

(72) Inventors: Ian Galton, Del Mar, CA (US); Gerry Taylor, Laguna Niguel, CA (US)

(73) Assignee: The Regents of the University of California, Oakland, CA (US)

( * ) Notice: Subject to any disclaimer, the term of this patent is extended or adjusted under 35 U.S.C. 154(b) by 224 days.

(21) Appl. No.: 14/302,626

(22) Filed: Jun. 12, 2014

(65) Prior Publication Data

US 2014/0368366 A1  Dec. 18, 2014

Related U.S. Application Data

(60) Provisional application No. 61/834,103, filed on Jun. 12, 2013.

(51) Int. Cl.
*H03M 3/00* (2006.01)
(52) U.S. Cl.
CPC ............... *H03M 3/386* (2013.01); *H03M 3/30* (2013.01); *H03M 3/38* (2013.01); *H03M 3/388* (2013.01); *H03M 3/412* (2013.01)
(58) Field of Classification Search
CPC ......... H03M 3/30; H03M 3/38; H03M 3/386; H03M 3/388; H03M 3/412
USPC ........................................ 341/143, 155, 120
See application file for complete search history.

(56) References Cited

U.S. PATENT DOCUMENTS

| | | | |
|---|---|---|---|
| 7,242,336 B1 * | 7/2007 | Jensen ................. | H03M 3/396 341/143 |
| 8,542,138 B2 | 9/2013 | Galton et al. | |
| 8,581,762 B2 * | 11/2013 | Sosio ................... | H03M 3/344 341/143 |
| 8,629,793 B2 * | 1/2014 | Tsai ....................... | H03M 3/39 341/143 |
| 9,094,040 B2 * | 7/2015 | Koli ..................... | H03M 3/462 |

OTHER PUBLICATIONS

Dhanasekaran et al., "A 20mHz BW 68dB DR CT ΔΣ ADC Based on a Multi-Bit Time-Domain Quantizer and Feedback Element," IEEE International Solid-State Circuits Conference, pp. 174-175, Feb. 2009.

Hovin et al., "Delta-Sigma Modulators Using Frequency-Modulated Intermediate Values," IEEE Journal of Solid-State Circuits, vol. 32, No. 1, pp. 13-22, Jan. 1997.

(Continued)

*Primary Examiner* — Brian Young
(74) *Attorney, Agent, or Firm* — Greer, Burns & Crain, Ltd.

(57) ABSTRACT

A continuous-time delta-sigma modulator for analog-to-digital conversion includes a pair of pseudo-differential signal paths including a pair of pseudo-differential signal paths including current-controlled ring oscillators as the load of open-loop common-source amplifiers that are driven by an analog input signal. The signal path produces digital values by sampling the open-loop current-controlled ring oscillators. A calibration circuit measures nonlinear distortion coefficients in a replica of the signal path. A nonlinearity corrector corrects digital values based upon the nonlinear distortion coefficients.

25 Claims, 18 Drawing Sheets

FIG. 4

(56) References Cited

OTHER PUBLICATIONS

Iwata et al., "The Architecture of Delta Sigma Analog-to-Digital Converters Using a Voltage-Controlled Oscillator as a Multibit Quantizer," IEEE Transactions on Circuits and Systems—II: Analog and Digital Signal Processing, vol. 46, No. 7, pp. 941-945, Jul. 1999.

Kim et al, "A Time-Based Analog-to-Digital Converter Using a Multi-Phase Voltage-Controlled Oscillator," IEEE International Symposium on Circuits and Systems, pp. 3934-3937, May 2006.

Mittergger et al., "A 20-mW 640-MHz CMOS Continuous-Time ΔΣ ADC With 20-MHz Signal Bandwidth, 80-dB Dynamic Range and 12-bit ENOB," IEEE Journal of Solid-State Circuits, vol. 41, No. 12, pp. 2641-2649, Dec. 2006.

Naiknaware et al, "Time-Referenced Single-Path Multi-Bit ΔΣ ADC using a VCO-Based Quantizer," IEEE Transactions on Circuits and Systems—II: Analog and Digital Signal Processing, vol. 47, No. 7, pp. 596-602, Jul. 2000.

Opteynde, "A Maximally-Digital Radio Receiver Front-End," IEEE International Solid-State Circuits Conference, pp. 450-451, Feb. 2010.

Park et al, "A 0.13•m CMOS 78dB SNDR 87mW 20MHz BW CT ΔΣ ADC with VCO-Based Integrator and Quantizer," IEEE International Solid-State Circuits Conference, pp. 170-171, Feb. 2009.

Taylor, et. al., "A Mostly Digital Variable-Rate Continuous-Time ADC ΔΣ Modulator," IEEE International Solid-State Circuits Conference, pp. 298-299, Feb. 2010.

Wismar et al., "A 0.2 V, 7.5μW, 20 kHz ΣΔ modulator with 69 dB SNR in 90 nm CMOS," European Solid-State Circuits Conference, pp. 206-209, Sep. 2007.

Yang et al, "A 100mW 10MHz-BW CT ΔΣ Modulator with 87dB DR and 91dBc IMD", IEEE International Solid-State Circuits Conference, pp. 498-499, Feb. 2008.

* cited by examiner

Over-Range Compensation Example

Over-Range Saturation Example

Overflow Logic:
if $a[n] > 7$ and $b[n-1] < 0$
  then $b[n] = \max\{-16, a[n] - 28\}$
else if $a[n] < -8$ and $b[n-1] > 0$
  then $b[n] = \min\{15, a[n] + 28\}$
else $b[n] = a[n]$

| | This Work | | | | | | | | [1] | [1] | [2] | [3] | [4] | [5] | [6] |
|---|---|---|---|---|---|---|---|---|---|---|---|---|---|---|---|
| Area (mm²) | 0.075 | | | | | | | | 0.07 | 0.07 | 0.7 | 1.5 | 0.45 | 0.9 | 0.15 | 0.4 |
| Process | 65nm G+ | | | | | | | | 65nm LP | 65nm LP | 180nm | 130nm | 130nm | 45nm | 90nm | 90nm |
| $f_s$ (MHz) | 1300 | | 1600 | | 1920 | | 2400 | | 1152 | 500 | 640 | 640 | 900 | 4000 | 500 | 640 |
| OSR | 128 | 128 | 64 | 64 | 32 | 64 | 48 | 32 | 32 | 64 | 32 | 16 | 22.5 | 16 | 10 | 32 |
| BW (MHz) | 5.08 | 10.2 | 6.25 | 12.5 | 15 | 20 | 25 | 37.5 | 18 | 3.9 | 10 | 20 | 20 | 125 | 25 | 10 |
| $f_{in}$ (MHz) | 1* | 1* | 1* | 2.3* | 2.3* | 3.5* | 4.9* | 7.49* | 2.3* | 1* | 2.4 | 3.68 | 2 | 41 | 2 | 2 |
| SNR (dB) | 76 | 74 | 76 | 75 | 75 | 76 | 74 | 71 | 70 | 71.5 | 84 | 76 | 81.2 | 65.5 | 64 | |
| SNDR (dB) | 75 | 73 | 74 | 74 | 70 | 74 | 73 | 70 | 67.3 | 71 | 82 | 74 | 78.1 | 65 | 63.5 | 65 |
| DR (dB) | 78 | 76 | 80 | 77 | 72 | 78 | 76 | 73 | 68 | 70 | 84 | 80 | 81.2 | 70 | 68 | 67 |
| THD (dB) | 81 | 79 | 82 | 82 | 79 | 81 | 80 | 76 | | | | | | 74 | | |
| SFDR (dB) | 82 | 82 | 83 | 83 | 80 | 82 | 81 | 77 | | | | | | | 81 | 72 |
| Power Supply (V) | 0.9 | | 1.0 | | 1.1 | | 1.2 | | 2.5/1.2 | 2.5/1.2 | 1.8 | 1.2 | 1.5 | 1.1/1.8 | 1.2 | 1.2 |
| Power Total (mW) | 11.5 | | 17.5 | | 26 | | 39 | | 17 | 8 | 100 | 20 | 87 | 256 | 8 | 6.8 |
| Power Analog (mW) | 3 | | 4 | | 5 | | 7 | | 5 | 2.5 | | | | | | |
| Power Digital (mW) | 8.5 | | 13.5 | | 21 | | 32 | | 12 | 5.5 | | | | | | |
| FOM (dB)** | 161 | 162 | 161 | 163 | 162 | 162 | 161 | 160 | 158 | 158 | 162 | 164 | 162 | 152 | 158 | 157 |
| FOM2 (fJ/conv)*** | 246 | 155 | 305 | 171 | 135 | 178 | 214 | 201 | 249 | 354 | 486 | 122 | 331 | 705 | 131 | 234 |

* Worst-case input frequency value over stated BW (SNDR remains unchanged or improves at higher $f_{in}$ values)
** FOM (SNDR) = SNDR + $10 \log_{10}$(BW/Power)
*** FOM2 = Power / (2BW*$2^{ENOB}$)

FIG. 18

MOSTLY-DIGITAL OPEN-LOOP RING OSCILLATOR DELTA-SIGMA ADC AND METHODS FOR CONVERSION

PRIORITY CLAIM AND REFERENCE TO RELATED APPLICATION

The application claims priority under 35 U.S.C. §119 from prior provisional application Ser. No. 61/834,103, which was filed on Jun. 12, 2013 and is incorporated by reference herein.

FIELD

A field of the invention is delta-sigma analog-to-digital signal converters and particularly, continuous-time delta-sigma modulator ADCs with clock rates several hundred MHz. ADCs and analog to digital conversion methods of the invention are widely applicable. Example applications of converters of the invention include digital radio receivers such as those used in cellular telephones, TV tuners, and wireless LAN receivers.

BACKGROUND

In many analog-to-digital converter (ADC) applications such as wireless receiver handsets, the bandwidth of the analog signal of interest is narrow relative to practical ADC sample-rates. Delta-sigma ($\Delta\Sigma$) modulator ADCs are used almost exclusively in such applications because they offer exceptional efficiency and relax the analog filtering required prior to digitization. Continuous-time $\Delta\Sigma$ modulator ADCs with clock rates above several hundred MHz have been shown to be particularly good in these respects. See, e.g., W. Yang et al, "A 100 mW 10 MHz-BW CT $\Delta\Sigma$ Modulator with 87 dB DR and 91 dBc MD", *IEEE International Solid-State Circuits Conference, pp.* 498-499, February 2008; G. Mittergger et al., "A 20-mW 640-MHz CMOS Continuous-Time $\Delta\Sigma$ ADC With 20-MHz Signal Bandwidth, 80-dB Dynamic Range and 12-bit ENOB," *IEEE Journal of Solid-State Circuits*, vol. 41, no. 12, pp. 2641-2649, December 2006; Park et al, "A 0.13 μm CMOS 78 dB SNDR 87 mW 20 MHz BW CT $\Delta\Sigma$ ADC with VCO-Based Integrator and Quantizer," *IEEE International Solid-State Circuits Conference*, pp. 170-171, February 2009; V. Dhanasekaran et al., "A 20 mHz BW 68 dB DR CT $\Delta\Sigma$ ADC Based on a Multi-Bit Time-Domain Quantizer and Feedback Element," *IEEE International Solid-State Circuits Conference*, pp. 174-175, February 2009. Continuous-time $\Delta\Sigma$ modulators with sample-rates in excess of several hundred megahertz have been shown to be particularly efficient in these types of applications because they allow much of the interference filtering to be done in the digital domain.

Typical conventional analog $\Delta\Sigma$ modulators present significant design challenges when implemented in highly-scaled CMOS IC technology optimized for digital circuitry. Such conventional $\Delta\Sigma$ modulators require analog comparators, high-accuracy analog integrators, high-linearity feedback digital to analog converters (DACs), and low-noise, low-impedance reference voltage sources. Continuous-time $\Delta\Sigma$ modulators with continuous-time feedback DACs additionally require low-jitter clock sources. These circuit logic units are increasingly difficult to design as CMOS technology is scaled below the 90 nm node because the scaling tends to worsen supply voltage limitations, device leakage, device nonlinearity, signal isolation, and 1/f noise.

An alternate type of $\Delta\Sigma$ modulator avoids the analog components and consists of a voltage-controlled ring oscillator (ring VCO) with its inverters sampled at the desired output sample-rate followed by digital circuitry. See, e.g., Hovin et al., "Delta-Sigma Modulators Using Frequency-Modulated Intermediate Values," *IEEE Journal of Solid-State Circuits*, vol. 32, no. 1, pp. 13-22, January 1997; Kim et al, "A Time-Based Analog-to-Digital Converter Using a Multi-Phase Voltage-Controlled Oscillator," *IEEE International Symposium on Circuits and Systems*, pp. 3934-3937, May 2006; Naiknaware et al, "Time-Referenced Single-Path Multi-Bit $\Delta\Sigma$ ADC using a VCO-Based Quantizer," *IEEE Transactions on Circuits and Systems—II: Analog and Digital Signal Processing*, vol. 47, no. 7, pp. 596-602, July 2000; Iwata et al., "The Architecture of Delta Sigma Analog-to-Digital Converters Using a Voltage-Controlled Oscillator as a Multibit Quantizer," *IEEE Transactions on Circuits and Systems—II: Analog and Digital Signal Processing*, vol. 46, no. 7, pp. 941-945, July 1999; Wismar et al., "A 0.2 V, 7.5 μW, 20 kHz $\Sigma\Delta$ modulator with 69 dB SNR in 90 nm CMOS," *European Solid-State Circuits Conference*, pp. 206-209, September 2007; Opteynde, "A Maximally-Digital Radio Receiver Front-End," *IEEE International Solid-State Circuits Conference*, pp. 450-451, February 2010.

Galton and Taylor U.S. Pat. No. 8,542,138 advanced the state of the art, and is incorporated by reference herein. See, also G. Taylor, I. Galton, "A Mostly-Digital Variable-Rate Continuous-Time Delta-Sigma Modulator ADC," *IEEE Journal of Solid-State Circuits*, vol. 45, no. 12, pp. 2634-2646, December, 2010. The patent discloses pseudo-differential mostly digital ADCs with a dual VCO-based $\Delta\Sigma$ modulator signal path calibration units.

SUMMARY OF THE INVENTION

A continuous-time delta-sigma modulator for analog-to-digital conversion includes a pair of pseudo-differential signal paths includes a pair of pseudo-differential signal paths including current-controlled ring oscillators as the load of open-loop common-source amplifiers that are driven by an analog input signal. The signal path produces digital values by sampling the open-loop current-controlled ring oscillators. A calibration circuit measures nonlinear distortion coefficients in a replica of the signal path. A nonlinearity corrector corrects digital values based upon the nonlinear distortion coefficients

BRIEF DESCRIPTION OF THE DRAWINGS

FIG. 8A illustrates details of an over-range corrected.

FIG. 18 is a table of data showing performance comparison of a preferred embodiment mostly digital ΔΣ ADC and various significant prior art ADCs.

DETAILED DESCRIPTION OF THE PREFERRED EMBODIMENTS

Figure 1:
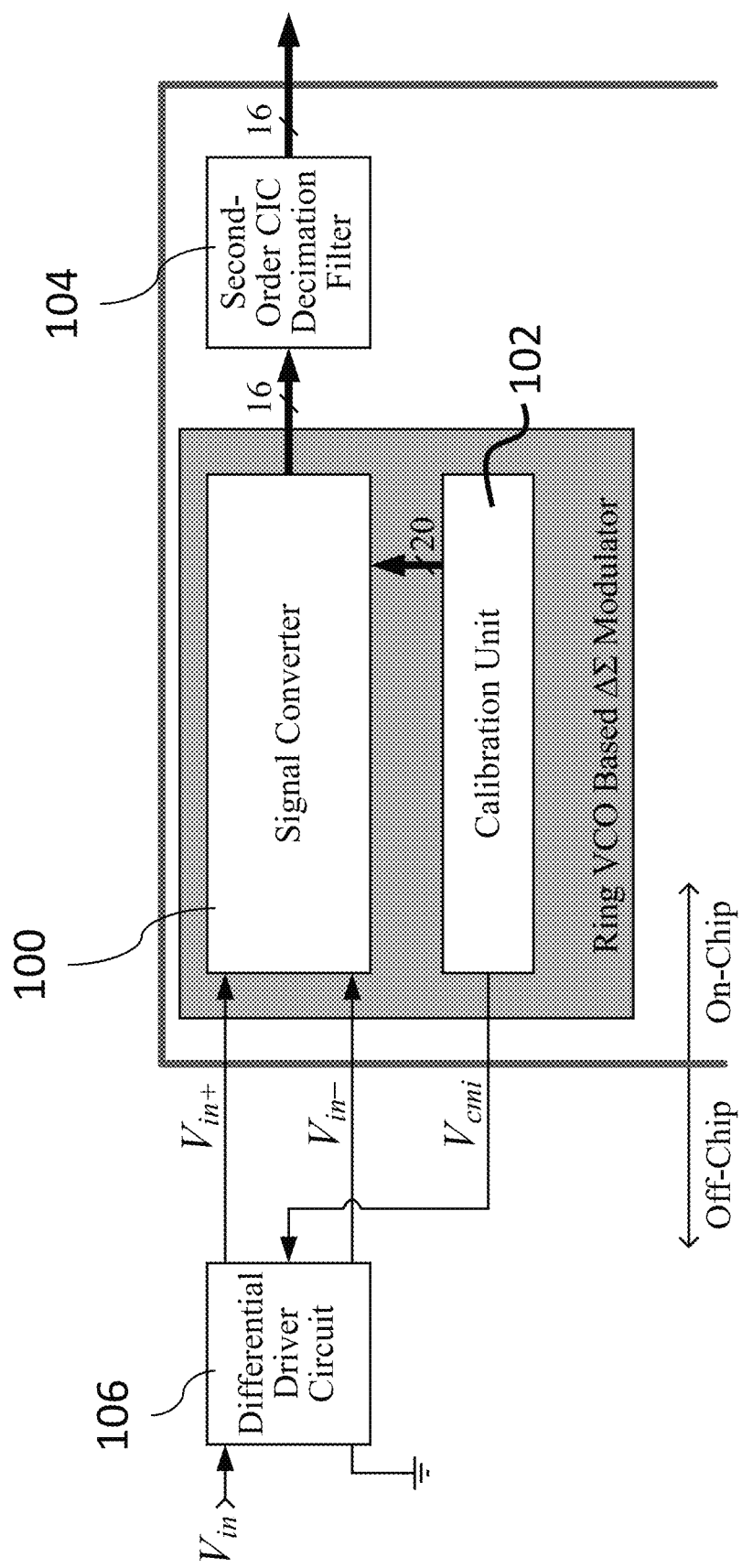
FIG. 1 is a block diagram of one of two duplicate oversampling analog-to-digital converters (ADC) from a preferred embodiment reconfigurable mostly digital $\Delta\Sigma$ ADC of the invention.

Embodiments of the invention provide methods and circuits to improve mostly-digital ring oscillator Delta-Sigma ADCs. A preferred embodiment provides a reconfigurable mostly-digital ring-oscillator based delta-sigma ADC with digitally background-calibrated open-loop V/I conversion front-end, quadrature coupled ring oscillators, and digital over-range correction. A preferred embodiment continuous-time delta-sigma modulator for analog-to-digital conversion consists mostly of digital circuitry, and is a voltage-controlled ring oscillator based design. The preferred embodiment provides improved digital background calibration and self-cancelling dither that enhances performance compared to prior converters that have digital background calibration. Preferred converters and methods for conversion use digitally background-calibrated open-loop V/I conversion in the VCRO (voltage controlled ring oscillator) to increase ADC bandwidth and enable operation from a single low-voltage power supply, quadrature coupled ring oscillators to reduce quantization noise, and digital over-range correction to improve dynamic range and enable graceful overload behavior.

Preferred embodiment ΔΣ converters of the invention provide performance comparable with state of the art ΔΣ converters, while occupying significantly less circuit area. Preferred embodiment ΔΣ converters of the invention are also reconfigurable. A preferred embodiment converter includes two pseudo-differential VCRO signal paths. The signal paths each have a pseudo-differential V/I circuit, a pair of current-controlled ring oscillators (ICROs), and digital processing block. Each pseudo-differential V/I circuit includes a pair of source degenerated open-loop common-source amplifiers with the ICROs as loads. The signal paths implement the function of a 1st order ΔΣ modulator with subtractive dither. Non-linear correction logic units correct second and third order distortion introduced by the ICROs as well as distortion introduced by the V/I circuits. An on-chip calibration unit VCRO signal path driven by a pseudo-random calibration sequence. It continuously measures the nonlinearity of the replica path, calculates new look-up data for the NLC (non-linear correction) logic units every few hundred milliseconds, and adaptively adjusts the center frequency of each 1CRO.

The open-loop common-source amplifiers of preferred embodiment converter set the center frequency of the ICROs, but avoid lower bandwidth constraints for prior op-amp feedback surfaces and 2.5V supply of prior designs. The present V/I circuit does, however, introduce significant $2^{nd}$ and $3^{rd}$ order nonlinear distortions. Introducing dither prior to the V/I circuit creates circuit complexity. In the preferred embodiment, the circuitry is kept simpler by avoiding this dither prior to the V/I circuit. As a result, intermodulation products of the dither and the V/I circuit output currents are not completely removed by the nonlinear correction logic units. These distortions are solved with a multiple VCRO architecture of the preferred converters that is described in detail below. The inventors recognized and determined that the most significant intermodulation terms are either pairs of differential-mode terms with opposite polarity on the two signal paths or common-mode terms, both of which cancel prior to the ΔΣ output. A slight source degeneration of the V/I circuits provides sufficient linearity to ensure that the remaining intermodulation terms are small enough to not limit performance in any significant manner.

Embodiments of the invention provide a performance improvement over Galton and Taylor U.S. Pat. No. 8,541,138. Maximum bandwidth is increased compared to the embodiments shown in the '138 patent. In addition, preferred embodiment modulators of the invention can operate from a single-low voltage power supply. Instead of using an op-amp based V/I conversion, embodiments of the invention rely upon a digitally background-calibrated open-loop V/I conversion. Embodiments of the invention provide an improved quantization noise floor, which is attributed to using quadrature-coupled ring oscillators instead of ring oscillators. Dynamic range is increased and graceful overload behavior is enabled by a digital over-range correction technique.

To the knowledge of the inventors, there are no publications of higher performance VCRO-based oversampling ADC integrated circuit (IC) prior to the effective filing date of this application. Preferred embodiments of the invention, provide a VCRO-based oversampling ADC integrated circuit (IC) that does not require any signal-path op-amps, analog integrators, feedback DACs, comparators, or reference voltages. Accordingly, its performance is set by the speed of its digital circuitry. Unlike conventional continuous-time ΔΣ modulator ADCs, both its supply voltage and sample-rate can be scaled dynamically to reduce power dissipation in trade for reduced signal bandwidth or conversion accuracy.

Preferred embodiments of the invention will now be discussed with respect to the drawings. The drawings may include schematic representations, which will be understood by artisans in view of the general knowledge in the art and the description that follows. Features may be exaggerated in the drawings for emphasis, and features may not be to scale.

FIG. 1 illustrates one of two oversampling ADCs used in a preferred embodiment. A signal converter 100 and calibration unit 102 generate a digital output sequence similar to that of a dithered, continuous-time, first-order ΔΣ modulator. The output is comparable to a ΔΣ modulator despite the unconventional architecture. A decimation filter 104 is a conventional second-order cascaded integrator-comb (CIC) decimation filter. Off chip, a differential driver circuit 106 drives the signal modulator.

Figure 2B:
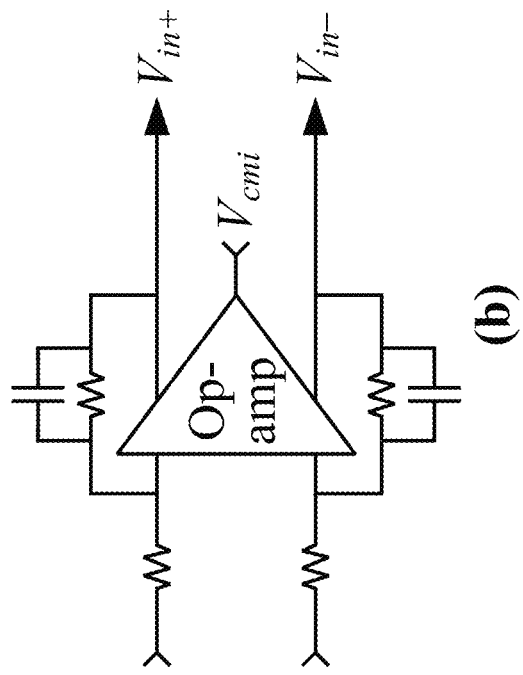
FIG. 2A shows an experimental differential driver circuit and FIG. 2B shows a preferred differential driver circuit more suitable for system-on-chip applications.

An ADC consistent with FIG. 1 was fabricated and tested. The fabricated IC was tested with the transformer-based differential driver circuit shown in FIG. 2A. In other applications such as a wireless receiver, the ADC can be integrated along with the down-conversion circuitry. A differential driver circuit consistent with FIG. 2B is preferred for such applications.

Preferred embodiments will be discussed along with a discussion of an example fabricated IC chip and testing of the fabricated IC chip. Improvements to the high performance mostly digital ΔΣ ADS of Galton and Taylor U.S. Pat. No. 8,541,138 will be addressed. Artisans will recognize broader aspects of the invention from the discussion of the example IC and from the comparison to the prior high performance ADC.

Figure 3:
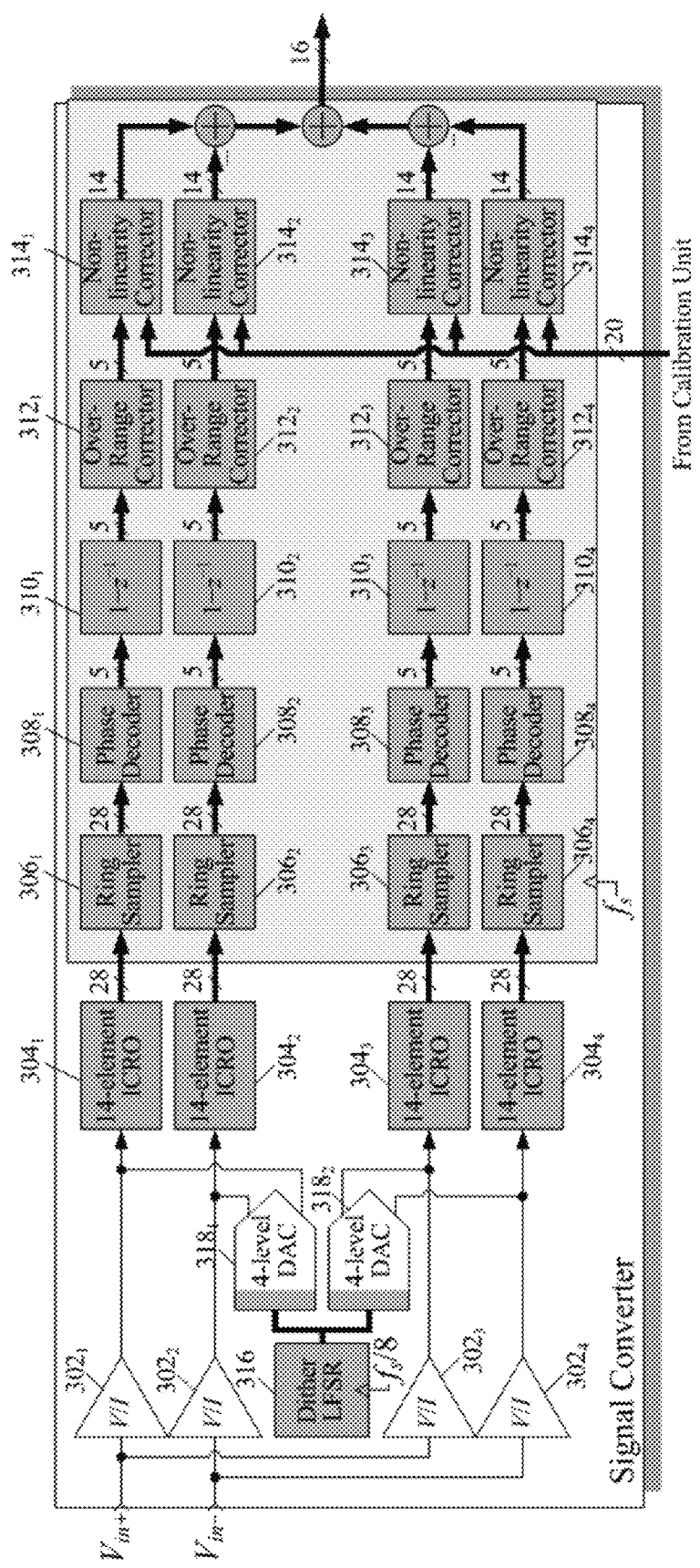
FIG. 3 is a block diagram of a preferred embodiment signal converter for a preferred embodiment oversampling $\Delta\Sigma$ ADC of the invention.
Figure 4:
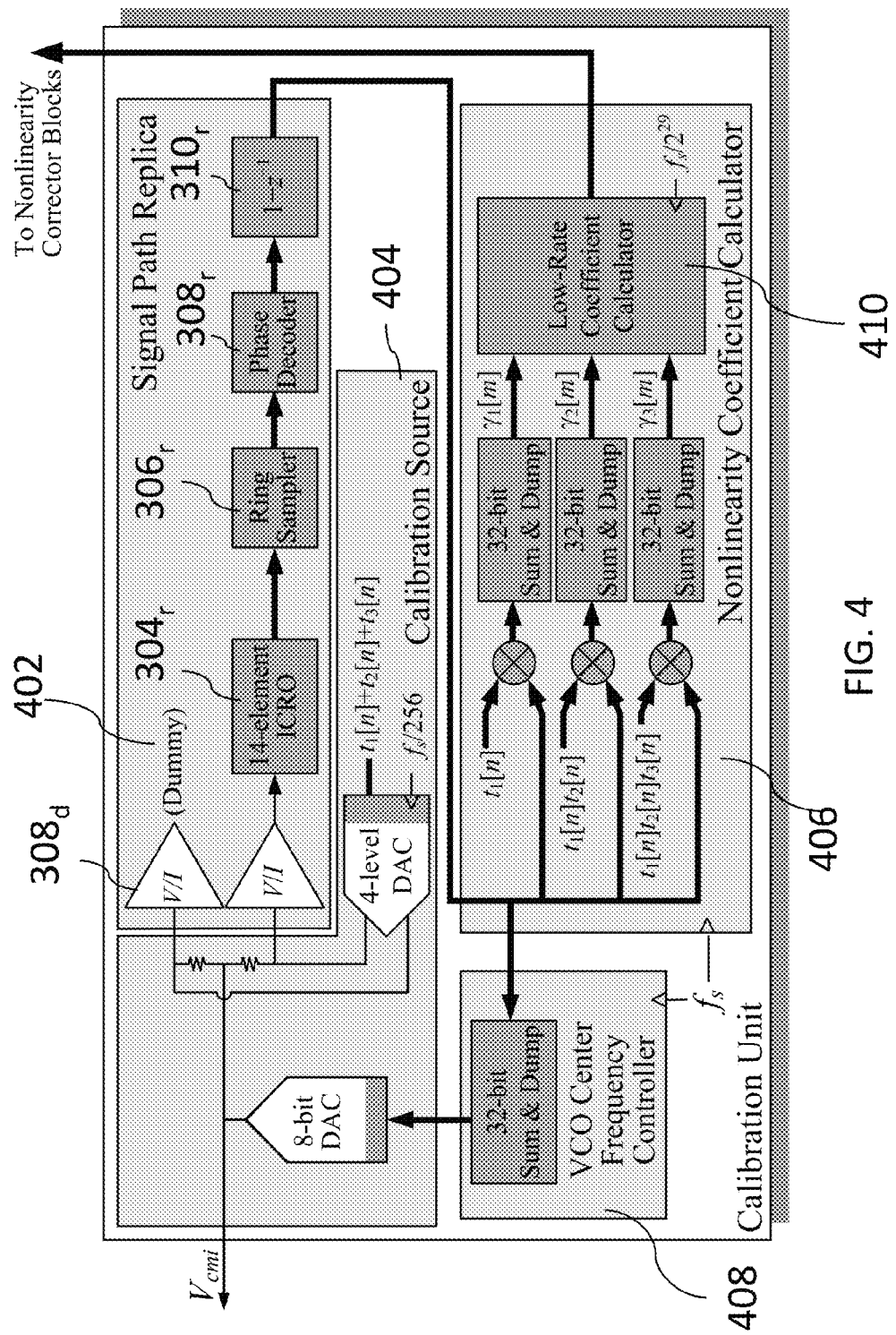
FIG. 4 is a block diagram of a preferred embodiment calibration unit for a preferred $\Delta\Sigma$ modulator of the invention.

A preferred embodiment includes a signal converter, shown in FIG. 3 and on-chip calibration unit shown in FIG. 4. As shown in FIG. 3, the signal converter contains four signal paths 1-4, where two pseudo-differential pairs are separately defined by path 1 with 2 and path 3 with 4. Each signal path includes a voltage-to-current converter (V/I) circuit $302_{1-4}$, a 14-element current controlled ring oscillator (ICRO) $304_{1-4}$, and digital logic components clocked at the ΔΣ modulator's output sample-rate, $f_s$. The digital logic includes a ring sampler $306_{1-4}$, a phase decoder $308_{1-4}$, a transfer function $1-z^{-1}$ logic $310_{1-4}$, an over-range corrector (ORC) $312_{1-4}$, and a nonlinearity corrector (NLC) $314_{1-4}$. The ring sampler in the fabricated ICE consisted of 28 D flip-flops that sample the pseudo-differential ICRO outputs on each $f_s$-rate clock edge, and the phase decoder $308_{1-4}$ was provided via combinatorial logic that maps the sampled outputs to phase measurements. The $1-z^{-1}$ logic converts the phase measurements to frequency measurements and the ORC $312_{1-4}$ corrects for $1-z^{-1}$ transfer function unit $310_{1-4}$ output roll-overs caused by large input signals. The NLC $314_{1-4}$ was provided via an $f_s$-rate look-up table that compensates for nonlinearity introduced by the V/I circuit $302_{1-4}$ and ICRO $304_{1-4}$. The FIG. 4 calibration unit continuously measures the nonlinearity and periodically reloads the look-up table of the NLC $314_{1-4}$ with new data. In the example IC, the reload was conducted every few hundred milliseconds.

The signal converter also contains a linear feedback shift register (LFSR) 316 that generates a pseudo-random 4-level white noise dither sequence which drives two nominally identical differential current DACs $318_{1-2}$. Each DAC output is connected to the ICRO input terminal in one of the signal paths thereby adding or subtracting the dither sequence to or from the positive or negative input signal in the current domain. The ICRO $304_{1-4}$, ring sampler $306_{1-4}$, phase decoder $308_{1-4}$, and $1-z^{-1}$ digital differentiator transfer function $310_{1-4}$ together implement the function of a first-order ΔΣ modulator, and the dither 316 causes the quantization noise to be essentially free of spurious tones. Particularly, The ring sampler $306_{1-4}$ samples the ring oscillators ICRO $304_{1-4}$, the phase decoder $308_{1-4}$ maps values from the ring sampler $306_{1-4}$ into a phase number, and the $1-z^{-1}$ digital differentiator transfer function $310_{1-4}$ differentiates the phase number. An over range corrector $312_{1-4}$ corrects roll-over error of the digital differentiator when it changes from its maximum value to its minimum value and can also clip the output. The nonlinearity corrector providing a corrected signal path output.

The four signal paths are grouped into a pair of pseudo-differential signal paths (1-2 and 3-4) that both operate on the same differential input signal. The ΔΣ modulator output is the sum of the two pseudo-differential signal path outputs. The only difference between the two pseudo-differential signal paths is the polarity with which the dither sequences are added. Therefore, summing the pseudo-differential signal path outputs doubles the desired signal component amplitude, cancels the dither components to the extent that the pseudo-differential signal paths are well matched, and causes the components corresponding to quantization noise to add in power (circuit noise causes the quantization noise from each signal path to be uncorrelated).

The calibration unit of FIG. 4 includes a signal path replica 402, a calibration source 404, a nonlinearity coefficient calculator 406, and a VCO center frequency controller 408. The signal path replica contains a copy of one of the signal converter's signal paths without the ORC and NLC $314_{1-4}$ logic units, and an extra V/I circuit $308d$ to provide a dummy input for the calibration source. The replica path elements are labelled with "r". The calibration source 404 sets the common-mode voltage of both the signal converter and the signal path replica to $V_{cmi}$, and it sets the differential-mode voltage of the signal path replica to the sum of three two-level pseudo-random sequences, $t_1[n]$, $t_2[n]$, and $t_3[n]$.

The nonlinearity coefficient calculator 406 continually measures the nonlinearity of the signal path replica to generate new NLC look-up table data, and the VCO center frequency controller 408 generates a digital measure of the difference between the desired mid-scale frequency, $f_s$, and the center frequency of the ICRO $304_{1-4}$. The calibration source 404 adjusts $V_{cmi}$, in a low-bandwidth feedback loop so as to zero the output of the VCO center frequency controller 408, thereby setting the mid-scale frequency of all the ICROs $304_{1-4}$ approximately to $f_s$. Continually updating the NLC $314_{1-4}$ data and the mid-scale frequency of the ICROs $304_{1-4}$ re-optimizes the ΔΣ modulator to track changes in temperature and output sample-rate, $f_s$ (thereby enabling reconfigurability).

In a preferred ADC of the invention, the V/I circuit, calibration source, and ICRO are each constructed differently from the corresponding units in the prior high performance ADC of U.S. Pat. No. 8,541,138. Also, the ORC $312_{1-4}$ is added and various additional circuit and layout improvements have been applied in a present preferred embodiment ΔΣ modulator that was fabricated and tested. In the fabricated embodiment, the TSMC 65 nm LP CMOS process was moved to the faster G+ process. The enhancements provided an improved FOM, operation from a single 0.9-1.2V supply, and a doubling of the maximum sample-rate and bandwidth relative to a prior circuit that was constructed as an example embodiment of the ADC in U.S. Pat. No. 8,541,138.

Signal Processing Overview

Figure 5:
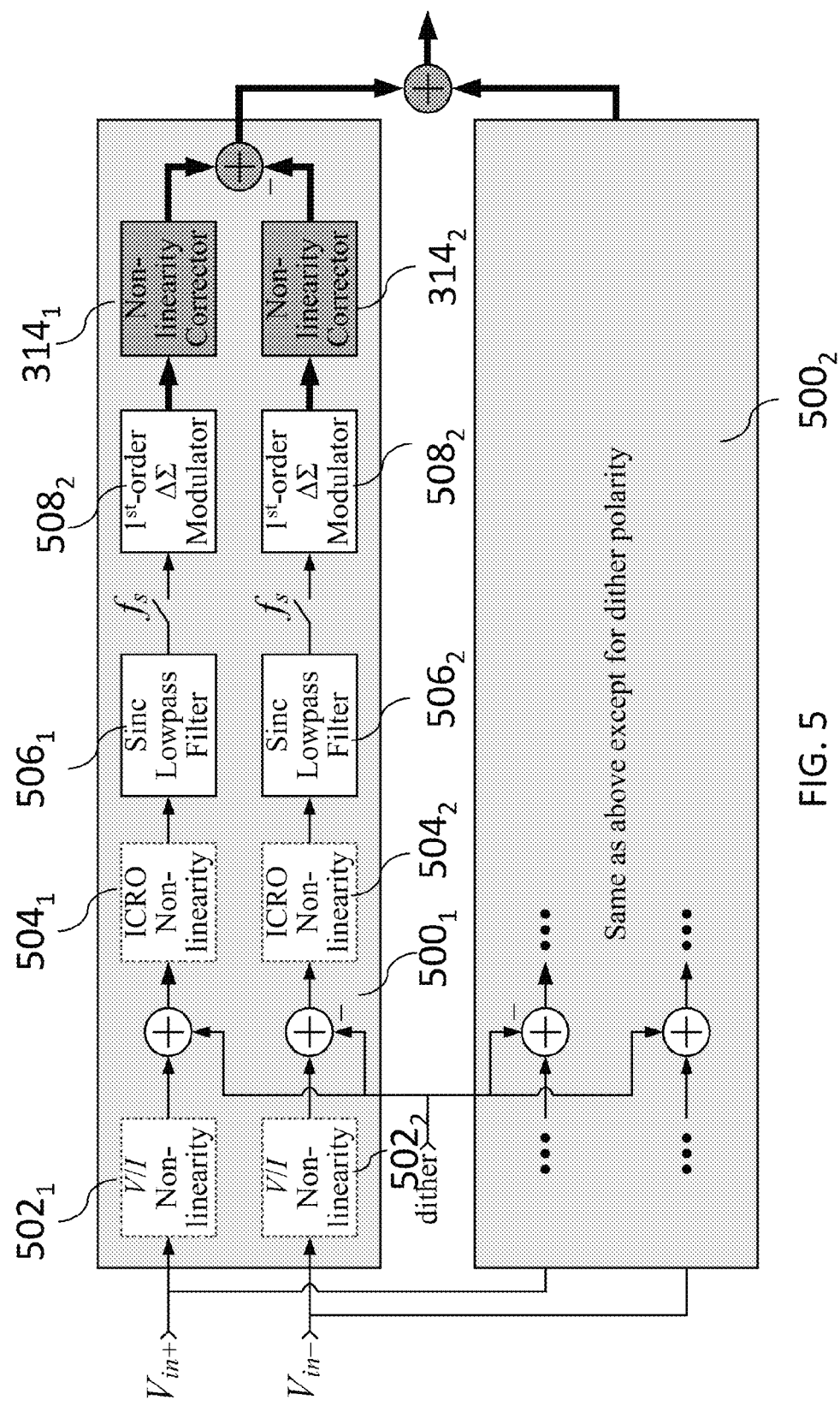
FIG. 5 is a block diagram of an equivalent signal model of a preferred $\Delta\Sigma$ modulator of the invention.

The signal converter of FIG. 3 performs the signal processing operations shown in FIG. 5 In FIG. 5 the pseudo-differential signal path $500_1$ corresponds to paths 1 and 2 of FIGS. 3 and $500_2$ corresponds to paths 3 and 4. The NLC logic units $314_{1-4}$ and subsequent adders are the same as those shown in FIG. 3, whereas the other blocks in FIG. 5 describe the behavior of the signal paths prior to the NLC $314_{1-4}$.

Each cascade of a V/I circuit $502_{1-4}$ and ICRO $504_{1-4}$ in the signal converter implements a voltage controlled oscillator (VCO). A change in current, $\Delta i$, at the input of any of the ICROs $504_{1-4}$ causes the ICRO's $504_{1-4}$ output frequency to change by $K_{ICRO}\Delta i/2\pi$, where $K_{ICRO}$ is the ICRO $504_{1-4}$ gain in units of radians per second per amp. Therefore, a change in voltage, $\Delta v$, at the input of each V/I circuit $302_{1-4}$ causes the corresponding ICRO's $504_{1-4}$ output frequency to change by $K_{ICRO}G_{V/I}\Delta v/2\pi$, where $G_{V/I}$ is the transconductance of the V/I converter. Ideally, both $K_{ICRO}$ and $G_{V/I}$ are independent of Δi and Δv, respectively, but both the V/I circuit and the ICRO introduce nonlinear distortion.

The functions $502_{1-4}$ and $504_{1-4}$ represent the nonlinear distortion introduced by the V/I circuits $302_{1-4}$ and the ICROs $304_{1-4}$. The dither is added positively or negatively after each V/I circuit nonlinearity and before each ICRO nonlinearity, and the output of each ICRO $304_{1-4}$ nonlinearity drives a low pass continuous-time sine filter $506_{1-4}$ with transfer function $$H_c(f) = K_{VCO} e^{-j\pi T_s f} \frac{\sin(\pi T_s f)}{\pi f} \quad (1)$$

where $Ts=1/f_s$, and $K_{VCO}$ is the VCO gain defined as $K_{ICRO} G_{V/I}$ when $V_{in+}=V_{in-}=V_{cmi}$. The output of each filter is sampled at a rate of fs, and the resulting sequence is passed through a first-order 5-bit ΔΣ modulator.

Open-Loop V/I Circuit.

V/I conversion in fabricated embodiments of each pseudo-differential signal path in the previous ΔΣ modulator of U.S. Pat. No. 8,541,138 is performed by a fully differential op-amp feedback circuit with sufficiently high linearity. Subsequent NLC logic units did not have to compensate for nonlinear distortion introduced by the V/I conversion. This allowed the $t_1[n]+t_2[n]+t_3[n]$ signal in the calibration unit to be added directly to the signal path replica's ICRO input in the current domain, which simplifies the design of the calibration source. However, this requires a 2.5 V supply and a high-performance op-amp to achieve the necessary linearity, headroom, and SNR, whereas the other components in the ΔΣ modulator operate from a 1.2 V supply.

Figure 6:
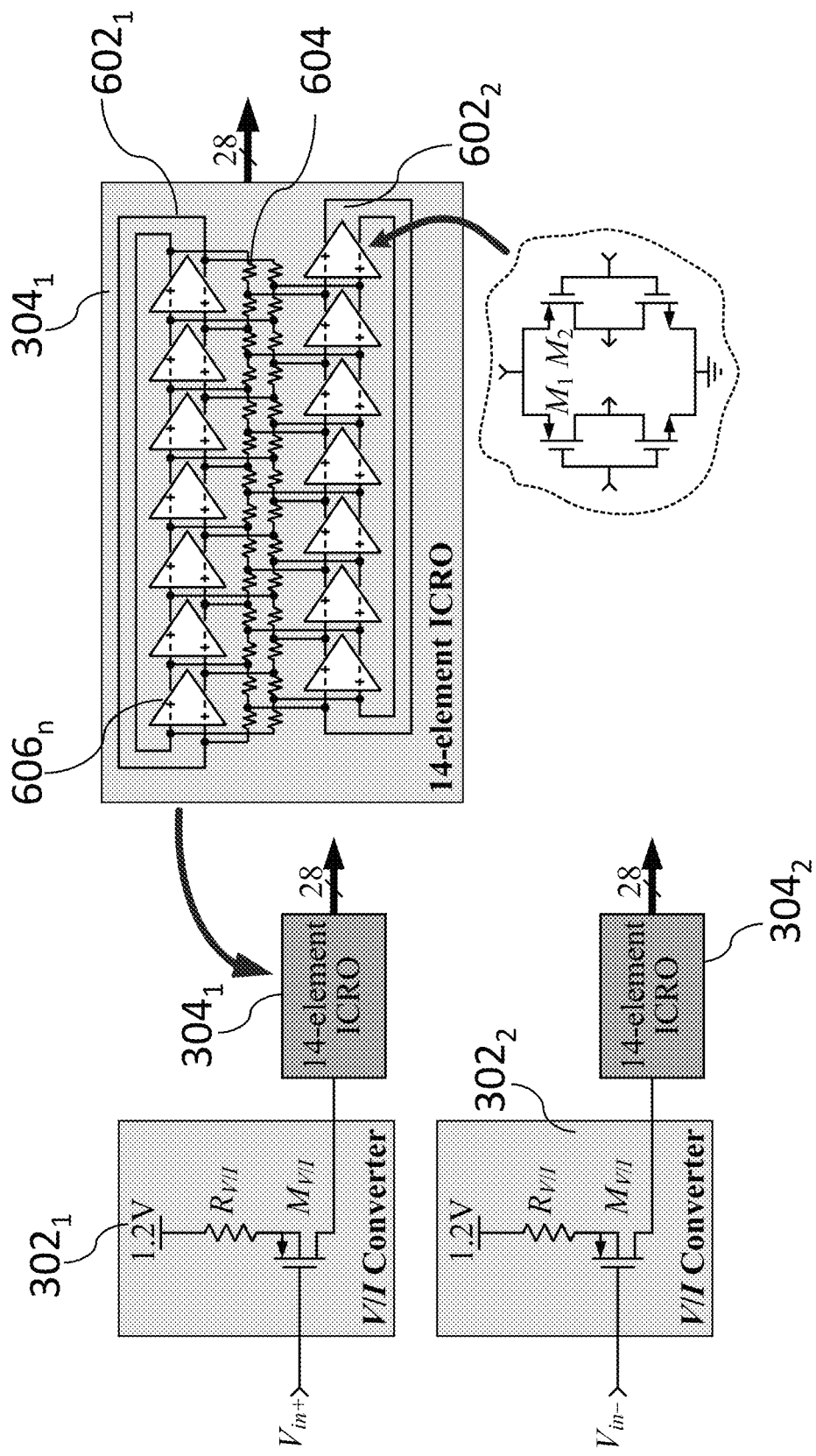
FIG. 6 example preferred circuit diagrams of the V/I converter and ICRO (current-controlled ring oscillator)

Each V/I circuit $302_{1-4}$ in the preferred ΔΣ modulator of FIG. 3 is preferably a non-differential source-degenerated common source amplifier as shown in FIG. 6. The $314_{1-4}$ V/I circuits $302_{1-4}$ can operate from the same 0.9 V to 1.2 V supply as the rest of the ΔΣ modulator and the pair of V/I circuit copies in each pseudo-differential signal path has a higher bandwidth, lower noise floor, and lower power dissipation than the V/I circuit in of U.S. Pat. No. 8,541,138.

Quadrature-Coupled Ring VCOs

In any ΔΣ modulator of a given order, the signal to quantization noise ratio (SQNR) over the signal bandwidth increases with the number of quantization levels and the oversampling ratio, and for a given signal bandwidth the oversampling ratio is determined by the ΔΣ modulator's sample-rate, $f_s$. The number of quantization levels and $f_s$ are not independent design variables in ring VCO based ΔΣ modulators, as they are in conventional ΔΣ modulators. The number of quantization levels is equal to twice the number of ring oscillator delay elements whereas $f_s$ is inversely proportional to the number of ring oscillator delay elements. Therefore, the SQNR ultimately depends on the minimum delay, τ, through each of the ring oscillator's delay elements, which is IC technology and supply voltage dependent.

FIG. 6 shows a system-level solution to reduce the quantization noise floor. As illustrated in FIG. 6 each of the ICROs $304_n$ has two 7-element sub-ICROs $602_{1-2}$ quadrature-coupled through a resistor network 604 to lock 90° out of phase with each other. The 7 pseudo-differential inverter outputs from each of the sub-ICROs are interlaced with those from the other to form the 14 pseudo-differential quadrature-coupled ICRO outputs. The result is equivalent to a 14-element conventional ICRO with a minimum inverter delay of τ/2 rather than τ. This reduces the ΔΣ modulator's quantization noise floor 6 dB below that which would otherwise have been imposed by the IC technology used in the example fabrication. Pseudo-differential current starved inverters $606_n$ are used for each delay element. In conventional ICROs, cross-coupled inverters are required at the delay element outputs to maintain a differential output signal. Such cross-coupled inverters are not required in the ICRO delay elements in the present ΔΣ modulator because the resistor network maintains differential delay element outputs in addition to keeping the two sub-ICROs locked 90° out of phase. Simulations indicate that eliminating the cross-coupled inverters reduces circuit noise by more than the resistor network increases circuit noise. Hence, the ICROs in the present ΔΣ modulator introduce less noise and the ICRO noise is much lower than the V/I circuit noise. The source-degenerated common source amplifiers introduce, however, nonlinear distortion that must be corrected by the subsequent NLC $314_{1-4}$ units and the pseudo-differential design maximizes differential-mode input voltage headroom at the expense of a narrow usable common mode input voltage range.

Open-Loop V/I Circuit Details and Implications

The nonlinear V/I circuits in the ΔΣ modulator can create dither intermodulation errors. Adding wide-bandwidth voltage signals with high precision in open-loop circuits is impractical. This is solved by adding the dither signals are added to the signal converter's ICRO inputs in the current domain. Therefore, as shown in FIG. 5 the input signal is subjected to the combined nonlinearity of the V/I circuit $302_{1-4}$ and ICRO $304_{1-4}$ whereas the dither is subjected only to the nonlinearity of the ICRO $304_{1-4}$. The NLC $314_{1-4}$ units correct for the nonlinearity seen by the input signal, but cannot also correct for the nonlinearity seen by the dither. This introduces intermodulation products of the signal and dither in each signal path.

The ICRO $304_{1-4}$ have very strong second-order distortion. The most significant intermodulation product is the direct product of the dither term and the signal term. The FIG. 3 signal converter's four signal path structure cancels this term in the ΔΣ modulator output up to the matching accuracy of the signal paths. Extensive simulations and experimental results demonstrate that the residual intermodulation term resulting from imperfect path matching and the higher-order intermodulation terms are well below the noise floor of the ΔΣ modulator.

This is a significant advantage of the four signal path structure of FIG. 3. A signal converter that consists of just two signal paths with a differential-mode input signal and common mode dither would have the self-cancelling dither property of the four signal path structure, but it would not cancel the intermodulation term described above.

V/I Circuit Details

In the example preferred fabrication of the FIGS. 3 and 4 converter, the transistor in each V/I circuit $302_{1-4}$ is a thin-oxide pMOS device with a nominal transconductance of $10^{-2} \Omega^{-1}$ and a nominal threshold voltage magnitude of 320 mV. The source degeneration resistor has a nominal resistance of 310Ω. At the maximum $f_s$ of 2.4 GHz, the V/I circuit's transconductance, $G_{V/I}$, is $2.2 \cdot 10^{-3} \Omega^{-1}$ which corresponds to a full-scale ADC differential input signal swing of 800 mV. Both $G_{V/I}$ and the signal swing decrease with ICRO frequency, which (optionally) allows the supply voltage to be scaled with $f_s$. In this design $f_s$ is tunable from 1.3 GHz to 2.4 GHz which corresponds to a supply voltage range of 0.9 V to 1.2 V. is roughly half the scaled supply voltage. The design is such that the necessary input bias voltage, which is supplied by the calibration source 404, is roughly half the scaled supply voltage.

Simulations indicate that even though the V/I circuit noise is much lower than that of the previous generation design of U.S. Pat. No. 8,541,138, it still is much higher than the ICRO noise. The input referred noise contributions from the transistors and resistors of the four V/I circuit copies in the $\Delta\Sigma$ modulator simulated with f=2.4 GHz are 5.4 nV/Hz$^{1/2}$ and 2.9 nV/Hz$^{1/2}$, respectively, and the 1/f noise corner of the transistors occurs at roughly 400 kHz.

Simulations indicate that the V/I circuit of FIG. 6 introduces strong second-order distortion but relatively weak higher-order distortion. For example, with $f_s$=2.4 GHz and a nearly full-scale 250 kHz sinusoidal input signal, the second, third, and fourth harmonics at the output of the V/I circuit are at −29 dBc, −43 dBc and −60 dBc, respectively. Interestingly, the ICRO introduces distortion with similar magnitudes but opposite signs so the distortion introduced by the V/I circuit and ICRO together is lower than that of just the V/I circuit. For example, under the same simulated conditions described above, the second, third, and fourth harmonics at the output of the cascade of the V/I circuit and ICRO are at −35 dBc, −49 dBc and −66 dBc, respectively.

The NLC $314_{1-4}$ only correct for second-order and third-order static distortion, so the V/I circuit nonlinearity must be well-modeled as a Taylor series in which only the first three terms are significant. This requires that the V/I circuit transistor $M_{V/I}$ be kept well in saturation with sufficient source degeneration. The small headroom budget limits the amount of resistor degeneration that could be used, so the Taylor series approximation starts to break down when the input signal exceeds −3 dB full scale (dBFS). Therefore, the SNDR of the $\Delta\Sigma$ modulator tends to peak when the input signal reaches −3 dBFS.

The Calibration Unit's Calibration Source

The requirement that the NLC $314_{1-4}$ correct for V/I circuit $302_{1-4}$ nonlinear distortion and the use of pseudo-differential V/I conversion complicates the calibration source relative to its counterpart in the $\Delta\Sigma$ modulator of U.S. Pat. No. 8,541,138, which artisans would generally consider unfavorable. However, present modulators use the more complicated design to advantage. In the prior $\Delta\Sigma$ modulator, the calibration source is a simple non-differential four-level current DAC connected to the input of the signal path replica's ICRO. In the present $\Delta\Sigma$ modulator the calibration source drives the signal path replica's V/I circuits with the $t_1[n]+t_2[n]+t_3[n]$ signal in the form of a differential voltage and it generates a common-mode voltage, $V_{cmi}$, for all of the $\Delta\Sigma$ modulator's V/I circuits.

Figure 7:
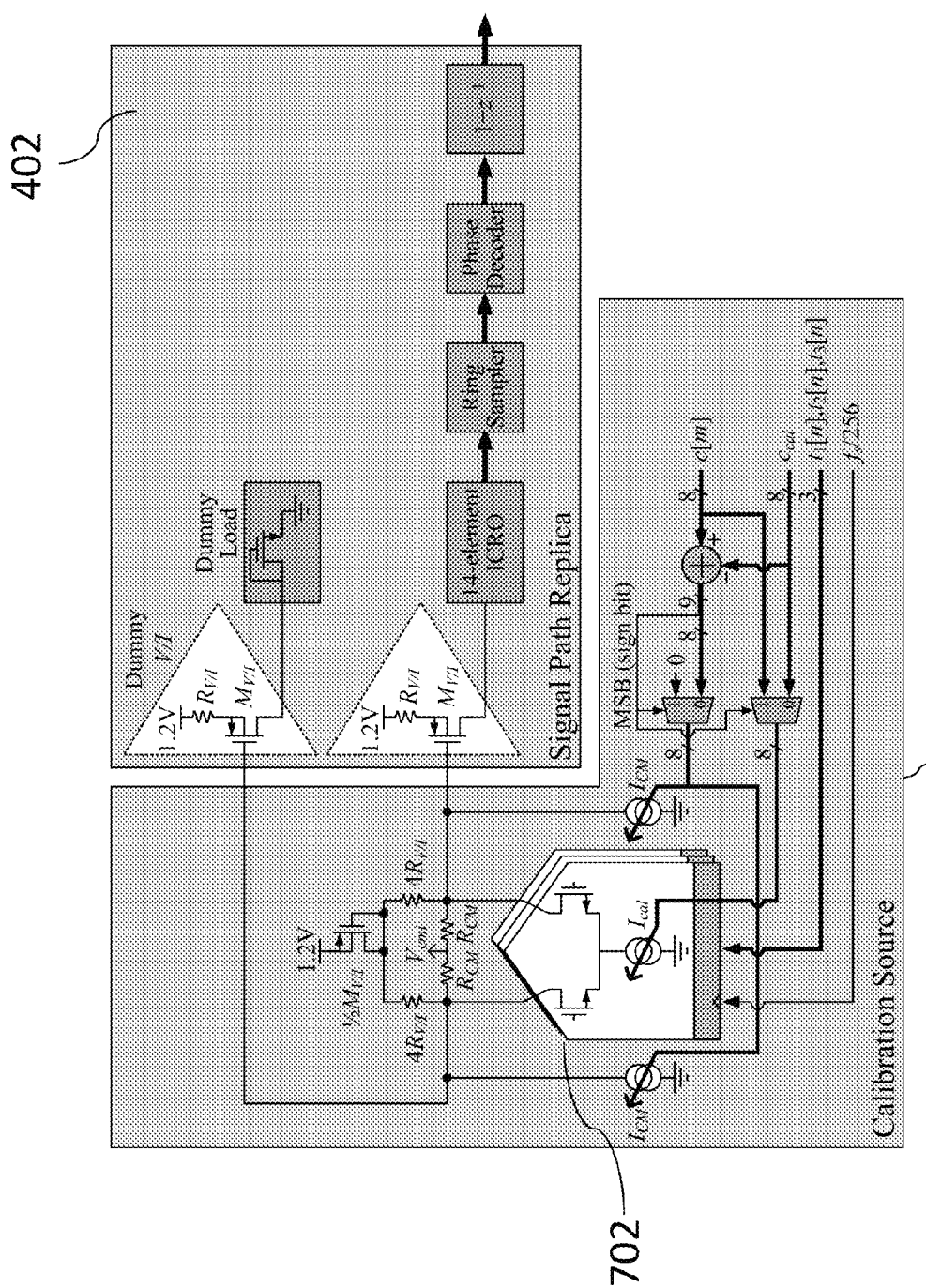
FIG. 7 illustrates details of a preferred calibration source in the calibration unit.

FIG. 7 shows that a preferred present calibration source 404 contains three current-steering cells 702. Each current steering cell steers its current, $I_{cal}$, to its left or right output depending on whether its one-bit input sequence is high or low, respectively. Each one-bit input sequence represents one of the two-level sequences $t_1[n]$, $t_2[n]$, or $t_3[n]$. The right and left outputs of the current steering cells are all connected to the right and left $4R_{V/I}$ resistors, respectively, so the differential voltage across the current steering cell right and left outputs represents the $t_1[n]+t_2[n]+t_3[n]$ signal.

The $R_{CM}$ resistors, which are much larger than the $4R_{V/I}$ resistors, are used to sense the common-mode voltage, $V_{cmi}$, of the $t_1[n]+t_2[n]+t_3[n]$ signal. This voltage is provided to the differential driver circuit as shown in FIGS. 1 and 2 to set the common-mode input voltage of the V/I circuits in the signal converter.

The diode connected pMOS transistor $\frac{1}{2}M_{V/I}$ has the same length and half the width of $M_{V/I}$. Its dimensions and the size of the resistors to which it is connected were chosen to mimic the stack-up of the V/I circuit such that the mid-scale current through each copy of the V/I circuit mirrors that through the $\frac{1}{2}M_{V/I}$ transistor.

The $I_{cal}$ and $I_{CM}$ current sources are each made up of eight output-connected power-of-two weighted current sources that are each turned off or on by a bit in the corresponding 8-bit bus. The component current sources in the two $I_{CM}$ current sources are each half the size of the corresponding component current sources in the $I_{cal}$ current source. The 8-bit value, $c_{cal}$, sets the differential amplitude of the $t_1[n]+t_2[n]+t_3[n]$ signal. Changing $c_{cal}$ adjusts both $I_{cal}$ and $I_{CM}$ such that $V_{cmi}$ remains nearly unchanged.

The c[m] sequence is the output of the VCO center frequency controller, which is the 8 most-significant bits (MSBs) of the VCO center frequency controller's sum and dump accumulator at the time of the last dump operation. It controls the common mode voltage of the $t_1[n]+t_2[n]+t_3[n]$ signal, and, therefore, $V_{cmi}$, to adjust the center frequency of all the ICROs to approximately $f_s$ via the feedback operation of FIGS. 3 and 4. The multiplexers in the calibration source set the $I_{CM}$ control bus to zero and the $I_{cal}$ control bus to c[m] in the event that c[m]−$c_{cal}$ temporarily goes negative while the feedback loop is settling.

Dither is not used in the signal path replica because it would increase the correlation time necessary to achieve accurate NLC look-up table data. Instead, the random nature of the $t_1[n]+t_2[n]+t_3[n]$ signal is relied upon to dither the signal path replica. Simulations indicate that this works well provided the differential amplitude of the $t_1[n]+t_2[n]+t_3[n]$ signal is between 40% and 100% of the signal path replica's full-scale input. Therefore, $c_{cal}$ should be chosen to keep the $t_1[n]+t_2[n]+t_3[n]$ signal within this range over expected process, supply voltage, and temperature (PVT) variations. Extensive simulations indicate that a relatively wide range of $c_{cal}$ values satisfy this requirement, although on the test IC it could be set via the serial port to provide testing flexibility.

Over-Range Correction

A disadvantage of conventional $\Delta\Sigma$ ADCs, particularly in applications involving automatic gain control, is that they go unstable with long recovery times if their input no-overload ranges are exceeded. Often this problem is addressed by keeping the amplitude of the input signal sufficiently small that even the occasional large transient does not exceed the input no-overload range. While this avoids the overload problem, it tends to waste the $\Delta\Sigma$ ADC's dynamic range because most of the time the input signal spans a range that is much smaller than the input no-overload range.

An analogous problem can occur in the high performance $\Delta\Sigma$ modulator presented in U.S. Pat. No. 8,541,138: the $1-z^{-1}$ transfer function outputs roll-over from their maximum to minimum values or vice versa when the input no-overload range is exceeded. Although the $\Delta\Sigma$ modulator does not take time to recover after such roll-overs, the decimation filter following the $\Delta\Sigma$ modulator is disturbed by the roll-overs and the resulting transient takes time to die out.

The ORC $312_{1-4}$ in the second-generation $\Delta\Sigma$ modulator eliminate this problem. The ORC $312_{1-4}$ extend the input no-overload range beyond that of the prior $\Delta\Sigma$ modulator of U.S. Pat. No. 8,541,138 and cause the output to clip for signals outside the widened no-overload range.

The Roll-Over Problem

During the nth f-rate clock interval each ring sampler samples the preceding ICRO's inverter outputs, and the subsequent phase decoder maps the sampled bits into a number, p[n], that represents a quantized version of the ICRO phase modulo-$2\pi$. Each ICRO has 14 delay elements, so p[n] can be any number in the range $\{0, 1, 2, \ldots, 27\}$, where a phase of $\pi$ radians corresponds to p[n]=14 and the phase quantization step-size is $2\pi/28$. To account for the modulo-$2\pi$ operation, each $1-z^{-1}$ logic unit generates its output as $$a[n] = \begin{cases} p[n] - p[n-1], & \text{if } -14 \le p[n] - p[n-1] \le 13, \\ p[n] - p[n-1] + 28, & \text{if } p[n] - p[n-1] < 14, \\ p[n] - p[n-1] - 28, & \text{otherwise.} \end{cases} \quad (2)$$

Thus, the range of a[n] is $\{-14, -13, -12, \ldots, 13\}$ where −14 represents a phase change of −π.

Provided an ICRO's average frequency over the nth clock interval is greater than or equal to $0.5 f_s$ and less than $1.5 f_s$ then a[n] is a quantized representation of ICRO's phase change minus 2π. For example, if the ICRO frequency is $0.5 f_s$ over the nth clock interval then a[n] is −14 which indicates that the phase change over the $1/f_s$ clock interval minus 2π is −π.

In contrast, if the ICRO's average frequency over the nth clock interval is less than $0.5 f_s$ or greater than or equal to $1.5 f_s$ then the phase change represented by a[n] is incorrect by a non-zero multiple of 2π. For example, if the ICRO frequency is $Kf_s$ over the nth clock interval where K is any positive integer, then a[n] is zero regardless of K whereas the true phase change over the clock interval minus 2π is 2π (K−1).

In the prior ΔΣ modulator of U.S. Pat. No. 8,541,138, the input no-overload range is defined as the maximum input voltage range for which all the ICROs have frequencies below $1.5 f_s$ but not below $0.5 f_s$. Therefore, the $1-z^{-1}$ logic outputs only roll-over and cause error if the input no-overload range is exceeded.

Over Range Corrector Logic Units

Extending the above analysis, it follows that a[n]+28 or a[n]−28 represents the ICRO's phase change over the nth clock interval minus 2π when the ICRO's average frequency over the clock interval is between $1.5 f_s$ and $2.5 f_s$ or less than $0.5 f_s$, respectively. The ORC $312_{1-4}$ exploit this result to compensate for roll-over events.

A preferred ORC logic unit is illustrated in FIGS. 8A-8D. The input-referred dither level in the signal converter is approximately −26 dBFS, so the instantaneous frequency of each ICRO $304_{1-4}$ in the signal converter is dominated by the input signal over most of the input no-overload range. Even with relaxed anti-alias filtering prior to the ΔΣ modulator, e.g., a single pole at $f_s/(4\pi)$, the ICRO's instantaneous frequency over the nth clock period is less than $0.5 f_s$ when and only when a[n]<−8 and a[n−1]>0. In such cases, the ORC $312_n$ sets its output to the minimum of 15 and a[n]+28, which is equivalent to correcting the roll-over error and then clipping the result to 15 if necessary. Similarly, the ICRO's instantaneous frequency over the nth clock period is greater than or equal to $1.5 f_s$ and less than $2.5 f_s$ when and only when a[n]>7 and a[n−1]<0. In such cases the ORC $312_n$ sets its output to the maximum of −16 and a[n]−28, which is equivalent to correcting the roll-over error and then clipping the result to −16 if necessary.

Figure 8B:
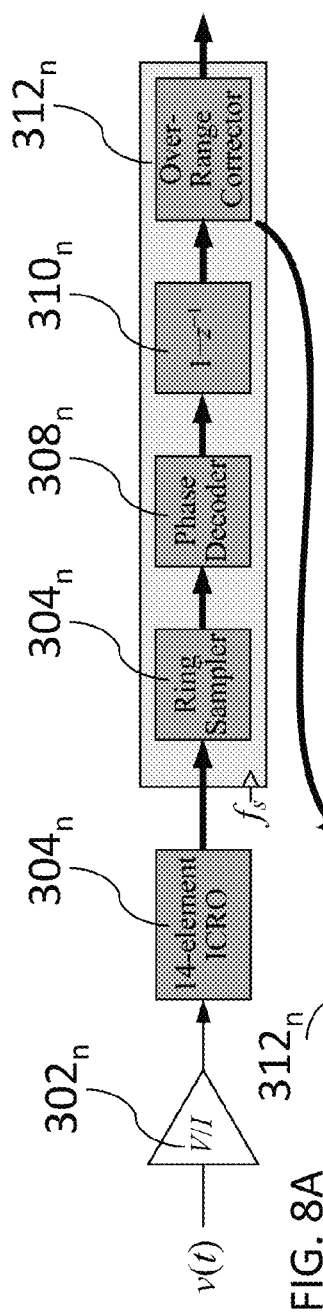
FIGS. 8B and 8C illustrate respective over-range compensation and over-range saturation signal examples.
Figure 8B:
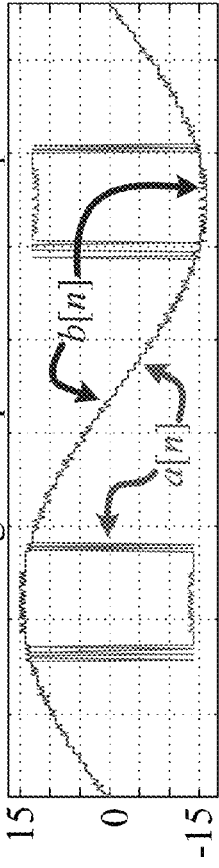
Figure 8C:
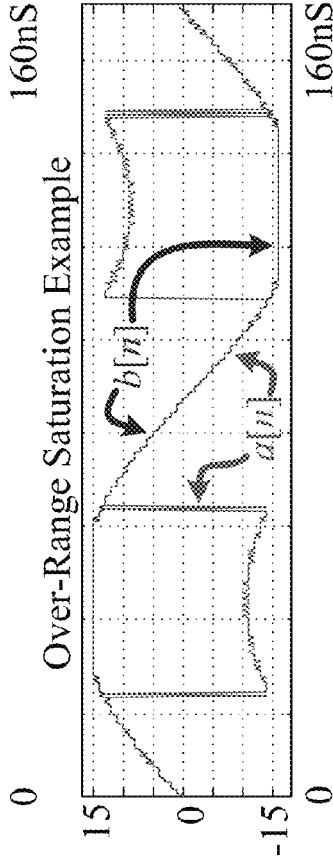
Figure 8D:
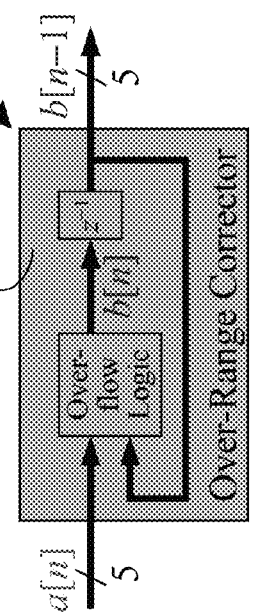
FIG. 8D illustrates overflow logic.

Therefore, as illustrated by the simulated ORC input and output sequences shown in FIGS. 8B-8D the output of each ORC logic unit, b[n], is a 5-bit sequence that differs from a[n] only in clock intervals during which a $1-z^{-1}$ logic roll-over event occurs. In the absence of a roll-over event b[n] ranges from −14 to 13, as seen in FIG. 8B. When a roll-over event occurs the ORC logic corrects the error down to a minimum value of −16 or a maximum value of 15 after which it clips as seen in FIG. 8C. The clipping represents a graceful overload behavior that avoids the roll-over problem described above.

The ORC logic units could alternately be modified to further extend the input range prior to clipping, but this is less preferred. If this is done, the V/I converter becomes strongly non-linear for input signals outside the input-referred clipping range, so there is little benefit to maintaining output values below −16 or above 15. Also, clipping the output to 5 bits reduces the power dissipation and circuit area from what would otherwise be required by the NLC logic units.

Digital Enhancements to the Calibration Unit

Preferred ΔΣ modulators of the invention include a calibration unit that incorporates three new digital enhancements. These include on-chip implementation of a low-rate coefficient calculator, automatic normalization of the output signal to represent input voltage independent of PVT variations, and adjustable duty cycle scaling to reduce power dissipation.

Figure 9:
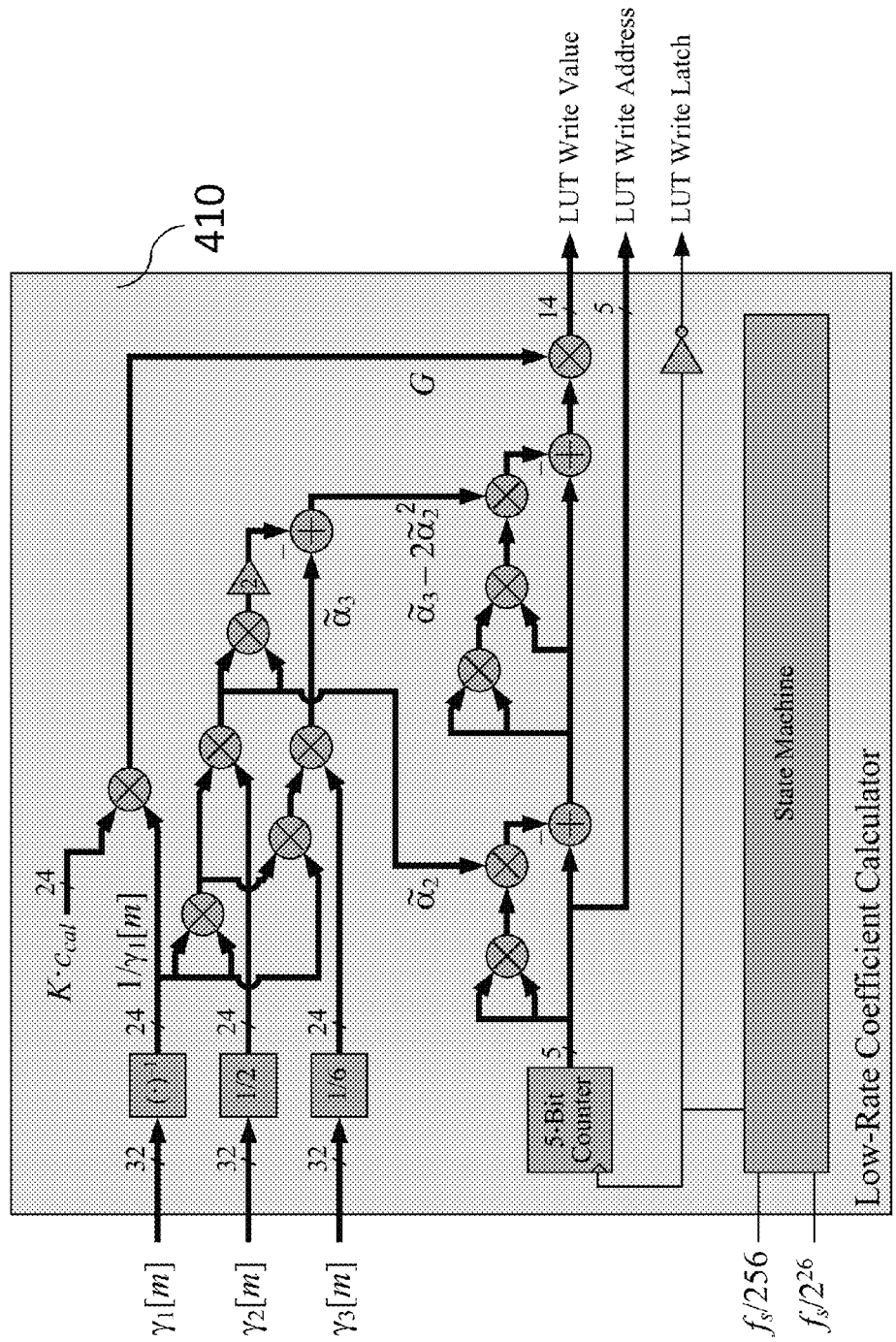
FIG. 9 illustrates signal processing details of a preferred low-rate coefficient calculator.

In FIG. 4 the low-rate coefficient calculator 410 converts the sequences, $\gamma_1[m]$, $\gamma_2[m]$, and $\gamma_3[m]$, into look-up table (LUT) data used by the NLC $314_{1-4}$ to correct second-order and third-order nonlinearity. This is performed on-chip by the low-rate coefficient calculator 410. FIG. 9 illustrates that the preferred low-rate coefficient calculator sequentially generates the 32 look-up table entries and writes them into the NLC logic units as they become available. The $\tilde{\alpha}_2$ and $\tilde{\alpha}_3$ intermediate variables shown in FIG. 9 are the estimated second and third Taylor series coefficient estimates described in U.S. Pat. No. 8,541,138 and the look-up table data cause each NLC logic unit to implement $$y[n]|_{corrected} = G[y[n] - \tilde{\alpha}_2(y[n])^2 - (\tilde{\alpha}_3 - 2\tilde{\alpha}_2^2)(y[n] - \tilde{\alpha}_2(y[n])^2)^3] \quad (3)$$

where y[n] denotes the NLC logic unit input sequence. The gain variable G is calculated to scale the ΔΣ modulator's output code such that the least significant bit (LSB) code step is 12.2 μV independent of PVT variation.

The sub 1 kHz look-up table update-rate allows area-efficient multi-clock implementation of the $1/\gamma_{1[m]}$ calculation and all the multiplications shown in FIG. 9 to be performed sequentially by reusing a single 24-bit multiplier. Consequently, the circuit area occupied by the example fabricated low-rate coefficient calculator is less than 0.01 mm2.

The calibration unit that was fabricated consistent with FIG. 4 also implements a duty cycle scaling feature. When the feature is enabled via serial port control, the calibration unit's duty cycle is reduced by repeatedly enabling the calibration unit for $2^{26}$ $f_s$-rate clock cycles and then disabling it for $7 \cdot 2^{26}$ clock cycles, thereby reducing its logic switching power dissipation by a factor of 8. When the ADC is powered up, the duty cycle scaling feature is disabled and the calibration unit generates full sets of NLC look-up table data at a rate of $f_s/2^{26}$ (once every 28 ms when $f_s$ is at its maximum value of 2.4 GHz). After a few $f_s/2^{26}$-rate update intervals the duty cycle scaling feature is enabled. Subsequent sets of NLC look-up table data are then generated at a rate of $f_s/2^{29}$ (once every 224 ms when $f_s$=2.4 GHz).

Ring Sampler Signal-Dependent Hysteresis Elimination

Figure 10A:
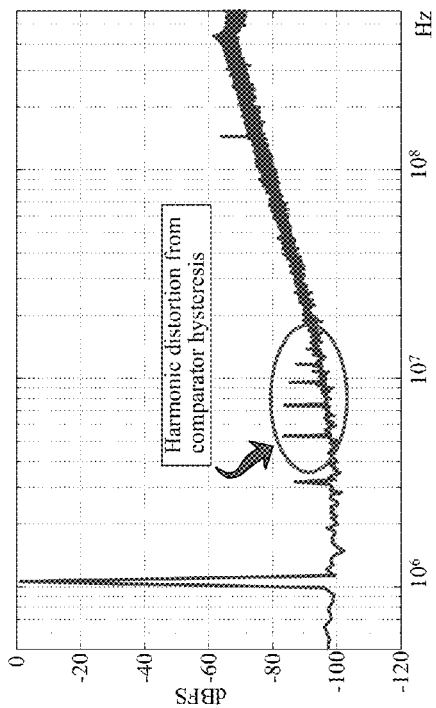
FIG. 10A (prior art) illustrates signal output of a prior mostly digital ΔΣ ADC of the inventors.

A measured output PSD plot from a ΔΣ modulator of U.S. Pat. No. 8,541,138 is shown in FIG. 10A. The harmonic distortion tones circled on the plot were not predicted by theory or simulation prior to fabricating the IC. Although relatively small, they are not insignificant, but the present design avoids the distortions.

Figure 10B:
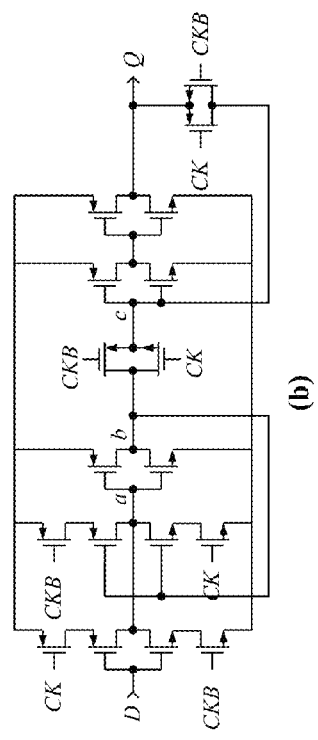
FIG. 10B (prior art) is a circuit diagram of a flip-flop in the ring sampler of the prior mostly digital ΔΣ ADC.

A circuit diagram of the standard transmission-gate flip-flop used previously in the ΔΣ modulator's ring sampler is shown in FIG. 10B. The design is such that node c is charged or discharged depending on the current state of the flip-flop. When the flip-flop transitions from hold to sample mode, the transmission gate switch across nodes b and c closes and the inverter connected to node b must charge or discharge the capacitance of both nodes b and c. This causes the flip-flop's decision threshold at each clock edge to depend on the current state of the flip-flop, i.e., it causes signal-dependent hysteresis. The result is relatively high-order harmonic distortion in the ΔΣ modulator output as indicated in FIG. 10A.

Figure 10C:
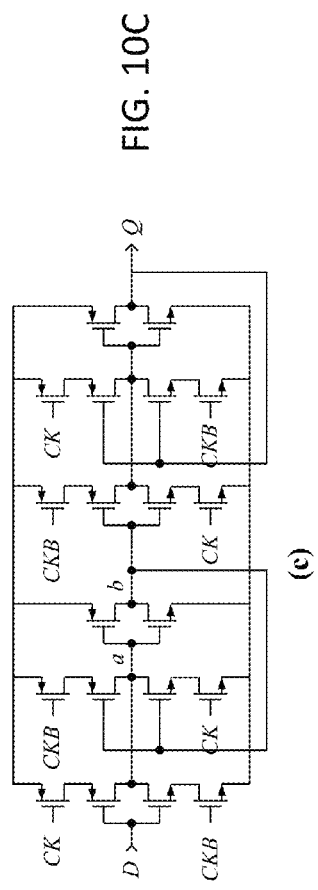
FIG. 10C is a flip-flop of a preferred present mostly digital ΔΣ ADC that addresses the harmonic distortion of the prior mostly digital ΔΣ ADC.

This is solved by the non-transmission-gate flip-flop shown in FIG. 10C. Simulations indicate that it exhibits far less signal-dependent hysteresis than the flip-flop of FIG. 10B. The ring samplers $306_{1-4}$ ΔΣ modulator incorporate the flop-flop of FIG. 10C.

High-Frequency Linearity Improvement

The calibration unit's nonlinearity correction algorithm assumes that the nonlinearity introduced by each V/I circuit and ICRO is independent of frequency. This assumption starts to break down and the correction implemented by the calibration unit and NLC logic units becomes less accurate as the frequency of the input signal is increased. Circuit simulations indicate that the most significant contributor to frequency-dependent nonlinearity in both ΔΣ modulator generations is parasitic capacitance at the current-starved input nodes of the ICROs.

Figure 11:
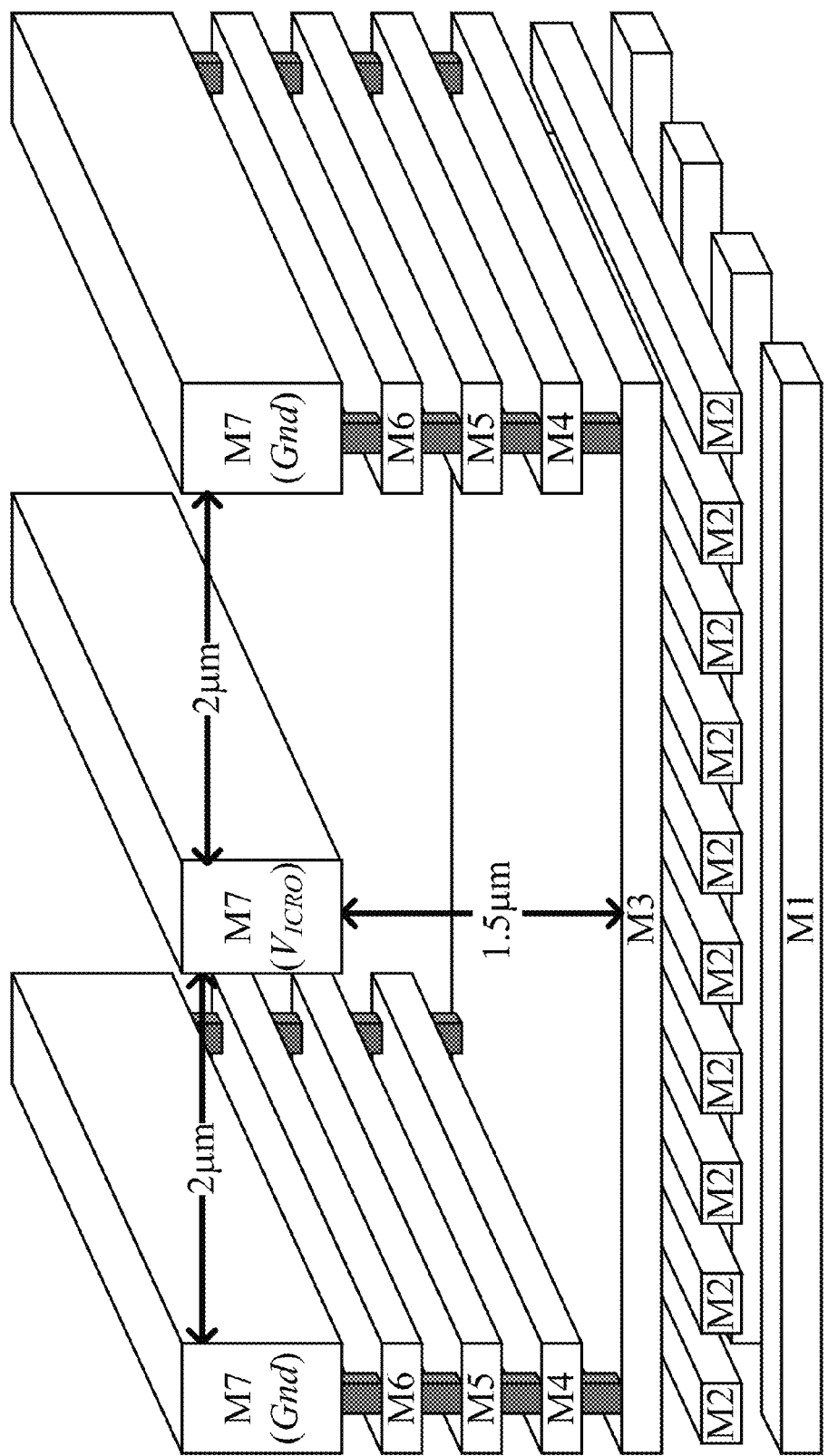
FIG. 11 illustrates a preferred connection layout for each dither DAC output and ICRO output of a preferred embodiment mostly digital ΔΣ ADC.
Figure 12:
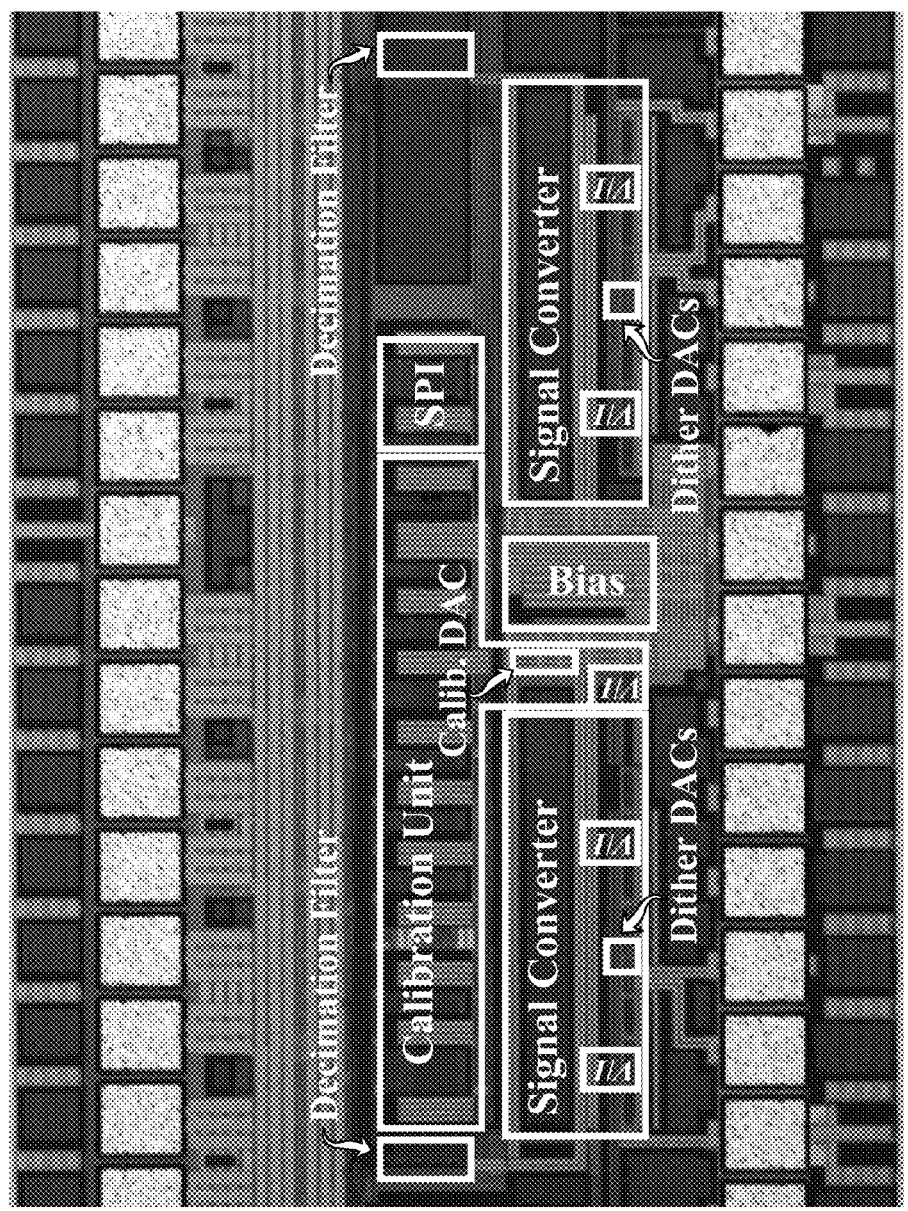
FIG. 12 is an image of the die of an experimental preferred embodiment mostly digital ΔΣ ADC.

A connection layout of FIG. 11 can reduce this parasitic capacitance to increase the usable signal bandwidth relative to the first-generation ΔΣ modulator. First, the relatively long interconnect lines between the dither DACs and the ICROs were each laid out as shown in FIG. 11, where the bathtub-like grounded metal structure surrounding the interconnect line provides shielding with low parasitic capacitance because of its large spacing from the interconnect line. Second, the diffusion capacitance at the coupled sources of the ICRO transistors labeled $M_1$ and $M_2$ in FIG. 6 is minimized. Each of $M_1$ and $M_2$ is laid out as two parallel devices with a shared source diffusion well to minimize capacitance at the current starved node of the inverter. Having the sources share a diffusion well instead of the drain reduces parasitic capacitance at the critical current starved node at the expense of increasing the drain capacitance, so for a given ICRO design and VLSI process it improves high-frequency linearity at the expense of reducing the maximum ICRO frequency Testing of Fabricated IC A die photograph of the test IC is shown in FIG. 12. The IC was fabricated in the TSMC 65 nm G+ process with the deep n-well and dual-oxide device options, but without the MiM capacitor option. It contains two ΔΣ modulators that share a common calibration unit, two decimation filters, LVDS output drivers, bias circuitry, and serial port interface logic.

All of the components of both ΔΣ modulators are implemented on-chip. The combined area occupied by the two signal converters, the calibration unit, and the ADC bias circuitry is 0.15 mm², so the area per ΔΣ modulator is 0.075 mm². The calibration unit and each signal converter occupy 0.07 mm² and 0.04 mm², respectively.

Figure 2A:
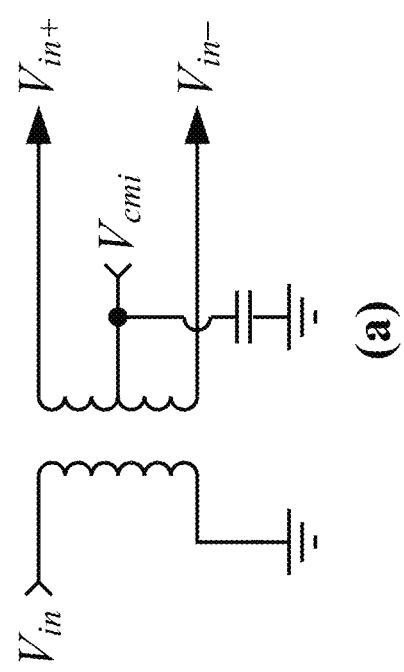

The test IC was packaged in a 64-pin LFCSP package which was socket mounted to a printed circuit test board. The test board contains input signal and clock conditioning circuitry, and an FPGA for data capture and serial port communication. A simplified diagram of the input conditioning circuitry is shown in FIG. 2A. The clock conditioning circuitry is also transformer-based; it converts the single-ended output of a laboratory signal generator to a differential clock signal for the IC. A single 0.9 V to 1.2 V power supply provides the supply voltage for all logic units on the IC. The IC has three power domains that connect to the single power supply via three sets of power and ground pins: one for the V/I circuits, one for the ring samplers and associated clock buffers, and one for all other circuit logic units.

Both ΔΣ modulators on 4 copies of the test IC were tested. Four of the ΔΣ modulators had 1 to 3 dB worse-than-typical SNDR because of second-order distortion. The variability was traced to gain mismatches among the pseudo-differential signal path halves resulting from the unfortunate choice of short-length degeneration resistors in the V/I circuits. This gain mismatch theory was verified experimentally by modifying the NLC data (via the serial port interface) to compensate for the gain mismatches, after which all the ΔΣ modulators exceeded typical performance. Simulations indicate that wider and longer degeneration resistors would result in negligible variability without introducing other problems.

Figure 13:
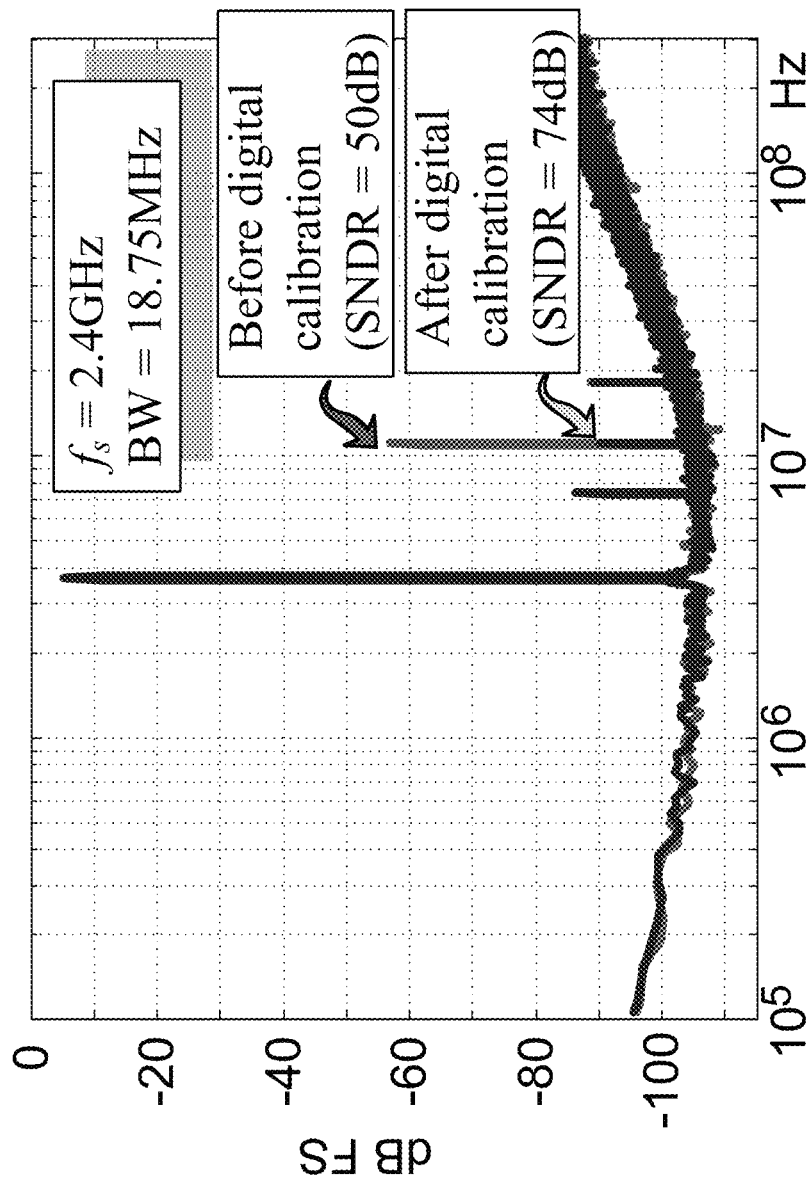
FIG. 13 illustrates representative measured PSD plots of the experimental ΔΣ modulator output before and after digital background calibration for $f_s$=2.4 GHz.

FIG. 13 shows typical measured output PSD plots with and without calibration enabled for $f_s$=2.4 GHz. The results indicate that without calibration the SNDR over an 18.75 MHz signal band is 50 dB and that calibration increases the SNDR to 74 dB. The 1/f noise corner occurs at a frequency of approximately 800 kHz which is roughly twice that predicted by simulations.

Figure 14:
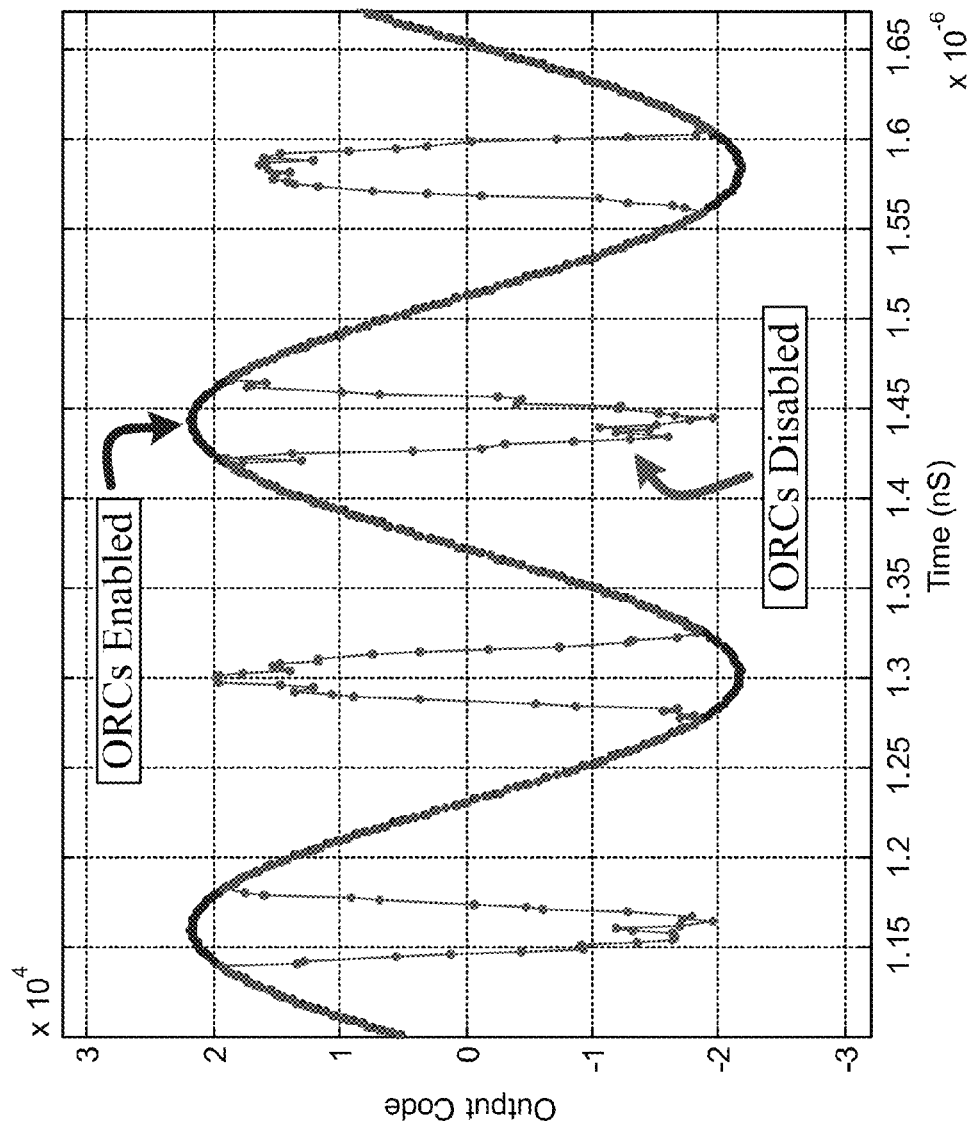
FIG. 14 illustrates measured decimation filter output sequences with the ORC blocks enabled and disabled for $f_s$=2.4 GHz and an input signal below the clipping level.
Figure 15:
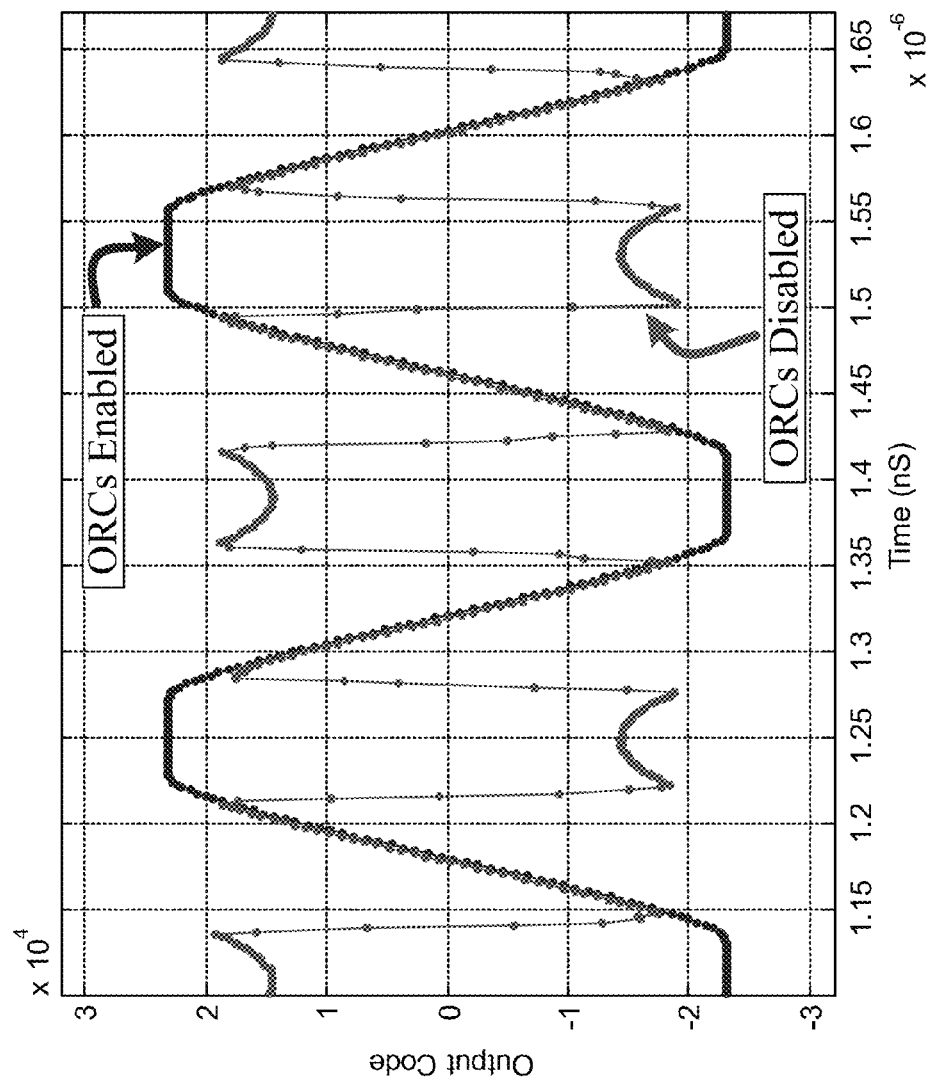
FIG. 15 illustrates measured decimation filter output sequences with the ORC blocks enabled and disabled for $f_s$=2.4 GHz and an input signal above the clipping level.

FIGS. 14 and 15 show measured decimation filter output sequences (as opposed to the simulated ΔΣ modulator output sequences shown in FIGS. 8B-8C) with and without the ORC logic units enabled for sinusoidal ΔΣ modulator input signals large enough to cause $1-z^{-1}$ logic unit roll-overs. They correspond to cases where the input signal is below and above the ORC logic unit clipping levels, respectively.

Figure 16A:
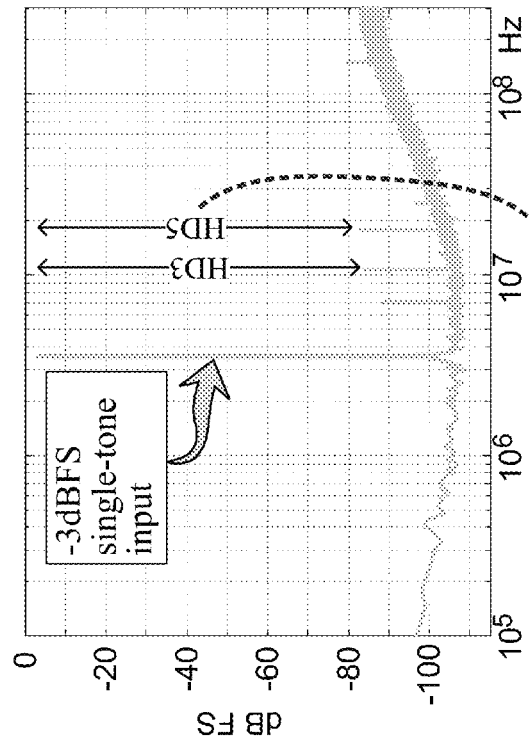
FIGS. 16A and 16B illustrate measured harmonic distortion versus input frequency for $f_s$=2.4 GHz before and after calibration.
Figure 16B:
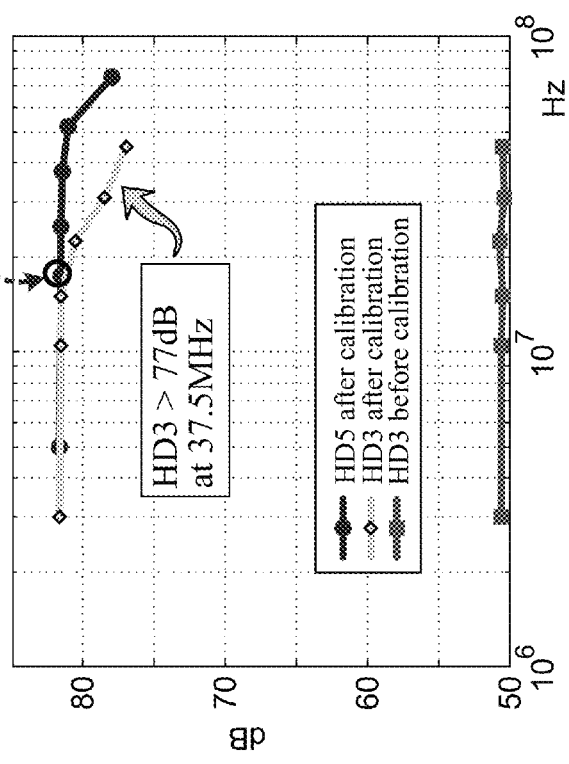

FIG. 16 shows measured harmonic distortion performance of the ΔΣ modulator with $f_s$=2.4 GHz. The bottom plot in the figure shows signal-to-third-order distortion (HD3) ratios before and after calibration and signal-to-fifth-order distortion (HD5) ratios after calibration for several −3 dBFS single tone input signals between 1 MHz and 15 MHz. The −3 dBFS input level was chosen because it corresponds to the ΔΣ modulator's peak SNDR. The HD5 ratios were not noticeably affected by calibration, so only the post-calibration HD5 ratios are shown. The top plot shows a measured output PSD plot corresponding to one pair of HD3 and HD5 measurements. The HD3 and HD5 ratios after calibration are greater than 81 dB up to about 19 MHz. Above 19 MHz the HD3 term starts to roll off at 20 dB per decade, although it remains greater than 77.5 dB throughout the maximum signal bandwidth of 37.5 MHz. Two-tone harmonic distortion tests yielded comparable results.

Figure 17:
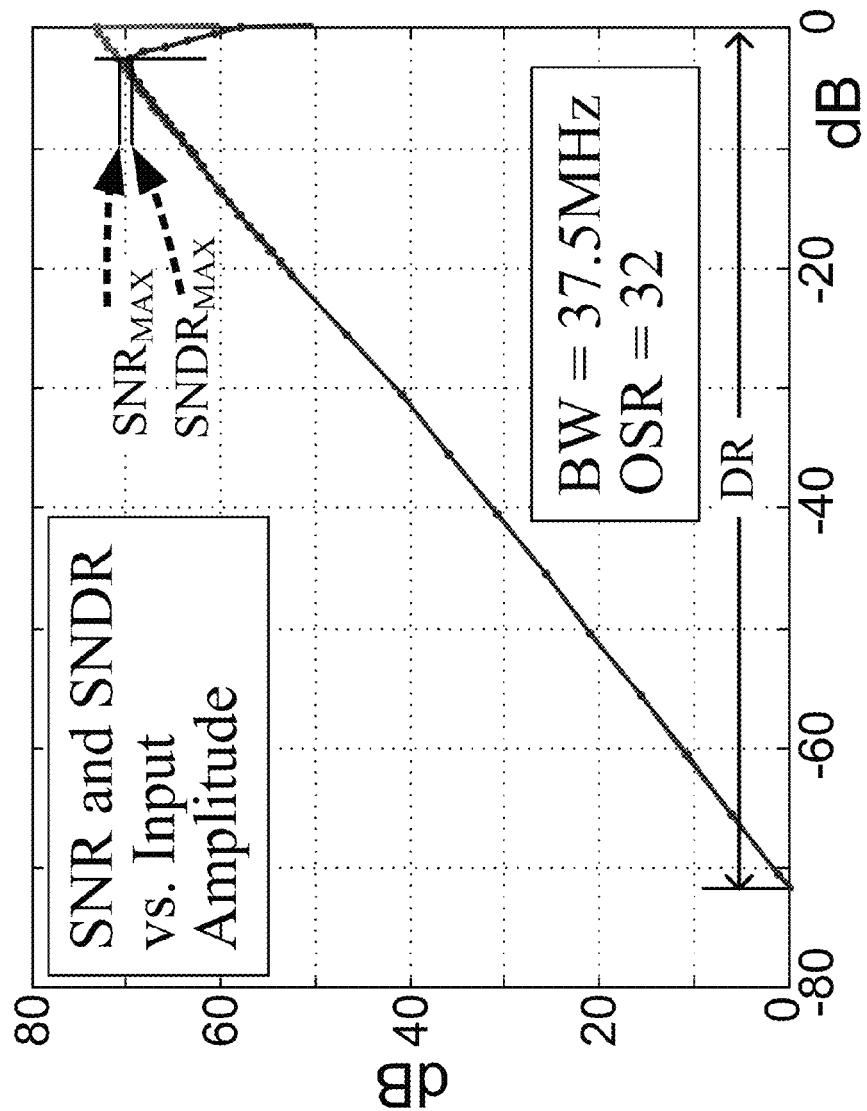
FIG. 17 plots measured SNR and SNDR versus input amplitude for $f_s$=2.4 GHz.

FIG. 17 shows plots of the SNR and SNDR versus amplitude of 7.49 MHz sinusoidal input signals measured over a 37.5 MHz signal bandwidth with $f_s$=2.4 GHz. The input signal frequency represents a worst-case situation because it is nearly the largest frequency for which the fifth harmonic falls within the 37.5 MHz signal bandwidth. The peak SNR, peak SNDR, and DR for this case are 70 dB, 69 dB, and 73 dB, respectively.

Measurements of the types described above with multiple values of $f_s$ ranging from 1.3 GHz to 2.4 GHz, several signal bandwidths, and signal frequencies corresponding to worst-case performance are tabulated in FIG. 18. The figure also tabulates data from comparable published state-of-the-art ΔΣ modulators. The numbers in the table correspond to the publications in the publication list below. A comparison indicates that the new ΔΣ modulator achieves state-of-the-art FOM performance, yet exceeds the previously published state-of-the-art in terms of area and reconfigurability. Furthermore, it is less sensitive to clock jitter and far more amenable to implementation in digitally-optimized CMOS processes than typical conventional ΔΣ modulators.

REFERENCE LIST

1. W. Yang, W. Schofield, H. Shibata, S. Korrapati, A. Shaikh, N. Abaskharoun, D. Ribner, "A 100 mW 10 MHz-BW CT ΔΣ Modulator with 87 dB DR and 91 dBc IMD", *IEEE International Solid-State Circuits Conference*, pp. 498-499, February 2008.
2. G. Mitteregger, C. Ebner, S. Mechnig, T. Blon, C. Holugigue, E. Romani, "A 20-mW 640-MHz CMOS Continuous-Time ΔΣ ADC With 20-MHz Signal Bandwidth, 80-dB Dynamic Range and 12-bit ENOB,"*IEEE Journal of Solid-State Circuits*, vol. 41, no. 12, pp. 2641-2649, December 2006.
3. M. Park, M. Perrott, "A 0.13 nm CMOS 78 dB SNDR 87 mW 20 MHz BW CT ΔΣ ADC with VCO-Based Integrator and Quantizer," *IEEE International Solid-State Circuits Conference*, pp. 170-171, February 2009.
4. M. Bolatkale, L. J. Breems, R Rutten, K. A. A. Makinwa, "A 4 GHz CT ΔΣ ADC with 70 dB DR and −74 dBFS THD in 125 MHz BW," *IEEE International Solid-State Circuits Conference*, pp. 470-472, February, 2011.
5. J. G. Kauffman, P. Witte, J. Becker, M. Ortmanns, "An 8 mW 50 MS/s CT ΔΣ Modulator with 81 dB SFDR and Digital Background DAC Linearization," *IEEE International Solid-State Circuits Conference*, pp. 472-473, February, 2011.
6. P. Crombez, G. Van der Plas, M. S. J. Steyaert, J. Craninckx, "A Single-Bit 500 kHz-10 MHz Multimode Power-Performance Scalable 83-to-67 dB DR CTAS for SDR in 90 nm Digital CMOS," *IEEE Journal of Solid-State Circuits*, vol. 45, no. 6, pp. 1159-117, June 2010.
7. M. Høvin, A. Olsen, T. S. Lande, C. Toumazou, "Delta-Sigma Modulators Using Frequency-Modulated Intermediate Values,"*IEEE Journal of Solid-State Circuits*, vol. 32, no. 1, pp. 13-22, January 1997.
8. J. Kim, S. Cho, "A Time-Based Analog-to-Digital Converter Using a Multi-Phase Voltage-Controlled Oscillator," *IEEE International Symposium on Circuits and Systems*, pp. 3934-3937, May 2006.
9. R. Naknaware, H. Tang, T. Fiez, "Time-Referenced Single-Path Multi-Bit ΔΣ ADC using a VCO-Based Quantizer," *IEEE Transactions on Circuits and Systems—II: Analog and Digital Signal Processing*, vol. 47, no. 7, pp. 596-602, July 2000.
10. A. Iwata, N. Sakimura, M. Nagata, T. Morie, "The Architecture of Delta Sigma Analog-to-Digital Converters Using a Voltage-Controlled Oscillator as a Multibit Quantizer," *IEEE Transactions on Circuits and Systems—II: Analog and Digital Signal Processing*, vol. 46, no. 7, pp. 941-945, July 1999.
11. U. Wismar, D. Wisland, P. Andreani, "A 0.2 V, 7.5 μW, 20 kHz ΣΔ modulator with 69 dB SNR in 90 nm CMOS," *European Solid-State Circuits Conference*, pp. 206-209, September 2007.
12. F. Opteynde, "A Maximally-Digital Radio Receiver Front-End," *IEEE International Solid-State Circuits Conference*, pp. 450-451, February 2010.
13. G. Taylor, I. Galton, "A Mostly-Digital Variable-Rate Continuous-Time Delta-Sigma Modulator ADC," *IEEE Journal of Solid-State Circuits*, vol. 45, no. 12, pp. 2634-2646, December, 2010.
14. G. Taylor, I. Galton, "A Reconfigurable Mostly-Digital ΔΣ ADC with a Worst-Case FOM of 160 dB," *Symposium on VLSI Circuits*, June 2012.
15. E. B. Hogenauer, "An Economical Class of Digital Filters for Decimation and Interpolation," *IEEE Transactions on Acoustics, Speech and Signal Processing*, vol. 29, pp. 155-162, April 1981.
16. G. Taylor, "Mostly Digital ADCs for Highly-Scaled CMOS Processes," PhD. dissertation, University of California, San Diego, 2011.
17. J. G. Maneatis, M. A. Horowitz, "Precise Delay Generation Using Coupled Oscillators," *IEEE Journal of Solid-State Circuits*, vol. 28, no. 12, pp. 1273-1282, December 1993.

While specific embodiments of the present invention have been shown and described, it should be understood that other modifications, substitutions and alternatives are apparent to one of ordinary skill in the art. Such modifications, substitutions and alternatives can be made without departing from the spirit and scope of the invention, which should be determined from the appended claims.

Various features of the invention are set forth in the appended claims.

The invention claimed is:

1. A continuous time delta-sigma modulator for analog to digital conversion, comprising:
a signal converter comprising a pair of pseudo-differential voltage controlled ring oscillator signal paths, each signal path comprising a pseudo-differential V/I circuit, a pair of current-controlled ring oscillators and a digital processor that processes outputs of the ring oscillators and conducts nonlinearity correction, wherein each pseudo-differential V/I circuit includes a pair of source degenerated open-loop common-source amplifiers with the current-controlled ring oscillators as loads;
on-chip with the signal processor, a calibration unit having a replica signal path driven by a pseudo-random calibration sequence that continuously measures the nonlinearity of the replica path, calculates new look-up data for the nonlinearity correction, and adaptively adjusts the center frequency of each current-controlled ring oscillator.

2. The modulator of claim 1, wherein said digital processor in each signal path comprises a ring sampler for sampling said ring oscillators, a phase decoder that maps values from the ring sampler into a phase number, a digital differentiator that differentiates the phase number an over range corrector that corrects roll over error of the digital differentiator and a nonlinearity corrector providing a corrected signal path output.

3. The modulator of claim 2, wherein the calibration unit comprises a signal path replica omitting an over-range corrector or nonlinearity corrector and an extra V/I circuit to provide a dummy input for the calibration source, wherein the calibration source sets common-mode voltage of both the signal converter and the signal path replica, and sets differential-mode voltage of the signal path replica to the sum of two-level pseudo-random sequences.

4. The modulator of claim 3, wherein the calibration source comprises three current steering cells, wherein each current steering cell steers its current to its left or right output depending on whether its one-bit input sequence is high or low, respectively, and the right and left outputs of the current steering cells are connected to resistors such that the differential voltage across the current steering cell right and left outputs represents an output signal.

5. The modulator of claim 3, wherein the calibration source comprises a plurality of current steering cells, wherein each current steering cell steers its signal to represents a two-level pseudo-random sequences, right and left outputs of the current steering cells are all connected to resistors so that the differential voltage across the current steering cell right and left outputs represents the sum of each that is made up of output-connected power-of-two weighted current sources that are each turned off or on by a bit in the corresponding bus, and wherein a value on the bus sets the differential amplitude of a signal output.

6. The modulator of claim 1, wherein the ring oscillators comprise pseudo-differential current starved inverters as delay elements and lack cross-coupled inverters at delay element outputs.

7. The modulator of claim 1, wherein the ring oscillators comprise a pair of sub-ring oscillators comprising a series of inverters, the pair of sub-ring oscillators being quadrature-coupled through a resistor network to lock 90° out of phase with each other.

8. The modulator of claim 7, wherein inverter outputs from each of the sub-ICROs are interlaced with those from the other to form pseudo-differential quadrature-coupled outputs.

9. The modulator of claim 1, wherein the calibration unit calculates and sets input common-mode level to maximize dynamic range of the converter.

10. The modulator of claim 9, wherein the calibration unit includes a calibration source that drives V/I circuits in the replica path with a differential voltage signal and generates a common-mode voltage for each differential V/I circuit of the converter.

11. The modulator of claim 10, wherein a load of the calibration source comprises a DAC load that mimics a current mirror with open loop V/I.

12. The modulator of claim 1, wherein the calibration unit measures and corrects for non-linearities of the open-loop common-source amplifiers.

13. The modulator of claim 1, wherein the calibration unit calculates and sets input common-mode level to maximize dynamic range of the converter.

14. The modulator of claim 1, wherein dither is added current-controlled ring oscillators in the current domain.

15. The modulator of claim 13, wherein the pair of pseudo-differential paths are configured to self-cancel dither signal even-order intermodulation distortion.

16. The modulator of claim 1, wherein the ring oscillators comprise quadrature coupled ring oscillators.

17. The modulator of claim 1, wherein the converter comprises over-range corrector circuits that extend dynamic range and clamp output.

18. The modulator of claim 1, wherein the nonlinearity correction scales output of the modulator such that the least significant bit code step is independent of process, supply voltage, and temperature variations.

19. The modulator of claim 1, wherein the digital signal processor comprises a ring sampler and the ring sampler comprises non-transmission gate flip-fllips.

20. A continuous-time delta-sigma modulator for analog-to-digital conversion, comprising:
a pair of pseudo-differential signal paths including current-controlled ring oscillators as the load of open-loop common-source amplifiers that are driven by an analog input signal, the signal path producing digital values by sampling the current-controlled ring oscillators;
a calibration circuit that measures nonlinear distortion coefficients in a replica of said signal path; and
a nonlinearity corrector correcting said digital values based upon said nonlinear distortion coefficients.

21. The modulator of claim 20, wherein the ring oscillators comprise a pair of sub-ring oscillators comprising a series of inverters, the pair of sub-ring oscillators being quadrature-coupled through a resistor network to lock 90° out of phase with each other.

22. The modulator of claim 20, wherein inverter outputs from each of the sub-ICROs are interlaced with those from the other to form pseudo-differential quadrature-coupled outputs.

23. The modulator of claim 20, wherein each signal path comprises a ring sampler for sampling said ring oscillators, a phase decoder that maps values from the ring sampler into a phase number, a digital differentiator that differentiates the phase number, an over range corrector that corrects roll over error of the digital differentiator and a nonlinearity corrector providing a corrected signal path output.

24. A continuous time delta-sigma modulator for analog to digital conversion, comprising:
pseudo-differential signal conversion means for digitally processing an input analog signal;
open-loop V/I conversion means within said pseudo-differential signal conversion means for sampling an input;
nonlinearity correction means for correcting signal conversion nonlinearity; and
replica signal calibration means for setting the nonlinearity correction means and for adaptively adjusting the open-loop current oscillator means.

25. A method for analog-to-digital signal conversion, the method comprising:
driving an open-loop current oscillator with a current derived from open-loop common-source amplifiers that are driven by an analog input signal, the signal path producing digital values by sampling the current-controlled ring oscillators;
phase converting a signal determined from an output of the ring oscillator and generating an output signal;
determining nonlinear distortion introduced by said ring oscillator with a replica path including a replica of said open-loop current oscillator and said phase converter; and
correcting said output signal based upon said nonlinear distortion determined in said step of determining.

* * * * *